(12) United States Patent
Morrow et al.

(10) Patent No.: US 11,201,221 B2
(45) Date of Patent: Dec. 14, 2021

(54) BACKSIDE CONTACT STRUCTURES AND FABRICATION FOR METAL ON BOTH SIDES OF DEVICES

(71) Applicant: Intel Corporation, Santa Clara, CA (US)

(72) Inventors: Patrick Morrow, Portland, OR (US); Rishabh Mehandru, Portland, OR (US); Aaron D. Lilak, Beaverton, OR (US); Kimin Jun, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/999,508

(22) Filed: Aug. 21, 2020

(65) Prior Publication Data

US 2020/0381525 A1 Dec. 3, 2020

Related U.S. Application Data

(62) Division of application No. 15/747,119, filed as application No. PCT/US2015/052440 on Sep. 25, 2015, now Pat. No. 10,784,358.

(51) Int. Cl.
*H01L 29/78* (2006.01)
*H01L 29/417* (2006.01)
(Continued)

(52) U.S. Cl.
CPC ............. *H01L 29/41791* (2013.01); *H01L 21/823431* (2013.01); *H01L 27/1266* (2013.01); *H01L 29/0847* (2013.01); *H01L 29/401* (2013.01); *H01L 29/4236* (2013.01); *H01L 29/6653* (2013.01); *H01L 29/66553* (2013.01);
(Continued)

(58) Field of Classification Search
CPC ........... H01L 29/41791; H01L 29/0847; H01L 29/401; H01L 29/6653; H01L 29/66553
See application file for complete search history.

(56) References Cited

U.S. PATENT DOCUMENTS

| 5,869,867 A | 2/1999 | Takeuchi |
| 2006/0006466 A1 | 1/2006 | Iinuma |

(Continued)

FOREIGN PATENT DOCUMENTS

CN    103855021    6/2014

OTHER PUBLICATIONS

International Search Report and Written Opinion for International Patent Application No. PCT/US2015/052440 dated Jun. 20, 2016, 10 pgs.

(Continued)

*Primary Examiner* — Elias Ullah
(74) *Attorney, Agent, or Firm* — Schwabe, Williamson & Wyatt, P.C.

(57) ABSTRACT

An apparatus including a circuit structure including a device stratum including a plurality of devices including a first side and an opposite second side; and a metal interconnect coupled to at least one of the plurality of devices from the second side of the device stratum. A method including forming a transistor device including a channel between a source region and a drain region and a gate electrode on the channel defining a first side of the device; and forming an interconnect to one of the source region and the drain region from a second side of the device.

24 Claims, 26 Drawing Sheets

(51) Int. Cl.
    *H01L 29/423*      (2006.01)
    *H01L 27/12*       (2006.01)
    *H01L 29/66*       (2006.01)
    *H01L 21/8234*     (2006.01)
    *H01L 29/08*       (2006.01)
    *H01L 29/40*       (2006.01)
    *H01L 21/225*      (2006.01)
    *H01L 21/265*      (2006.01)

(52) U.S. Cl.
    CPC .. *H01L 29/66795* (2013.01); *H01L 29/66803* (2013.01); *H01L 29/78* (2013.01); *H01L 29/785* (2013.01); *H01L 21/2254* (2013.01); *H01L 21/26513* (2013.01); *H01L 29/66545* (2013.01)

(56) References Cited

U.S. PATENT DOCUMENTS

| | | |
|---|---|---|
| 2006/0115943 A1 | 6/2006 | Koyanagi |
| 2007/0296002 A1 | 12/2007 | Liang et al. |
| 2008/0316714 A1 | 12/2008 | Eichelberger et al. |
| 2012/0088339 A1 | 4/2012 | Molin et al. |
| 2014/0332749 A1 | 11/2014 | Yokoyama |
| 2016/0240616 A1* | 8/2016 | Cea ................. H01L 21/823807 |

OTHER PUBLICATIONS

International Preliminary Search Report for International Patent Application No. PCT/US2015/052440 dated Apr. 5, 2018, 9 pages.
Office Action from Taiwan Patent Application No. 105125783 dated Dec. 30, 2019, 11 pages.
Notice of Allowance from Taiwan Patent Application No. 105125783 dated Apr. 27, 2020, 1 page, with English translation.
Office Action from Chinese Patent Application No. 201580082573.6, dated Dec. 1, 2020, 6 pages, No translation.
Office Action from Taiwan Patent Application No. 109123246, dated Nov. 25, 2020, 6 pages, with English translation.
Office Action from Taiwan Patent Application No. 109123246, dated Feb. 25, 2021, 5 pages.
Office Action from Chinese Patent Application No. 201580082573.6, dated Jul. 2, 2021, 4 pages.

* cited by examiner

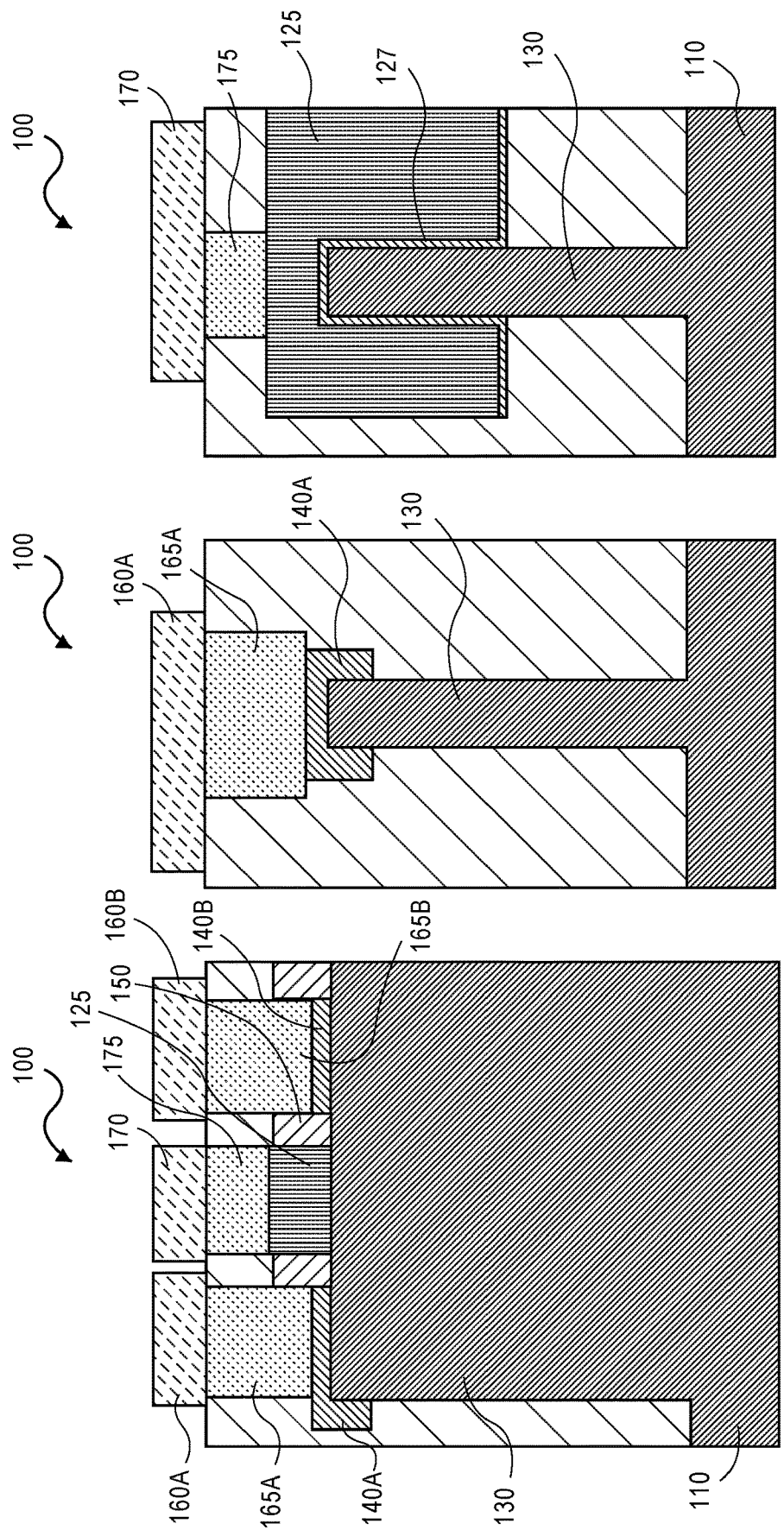

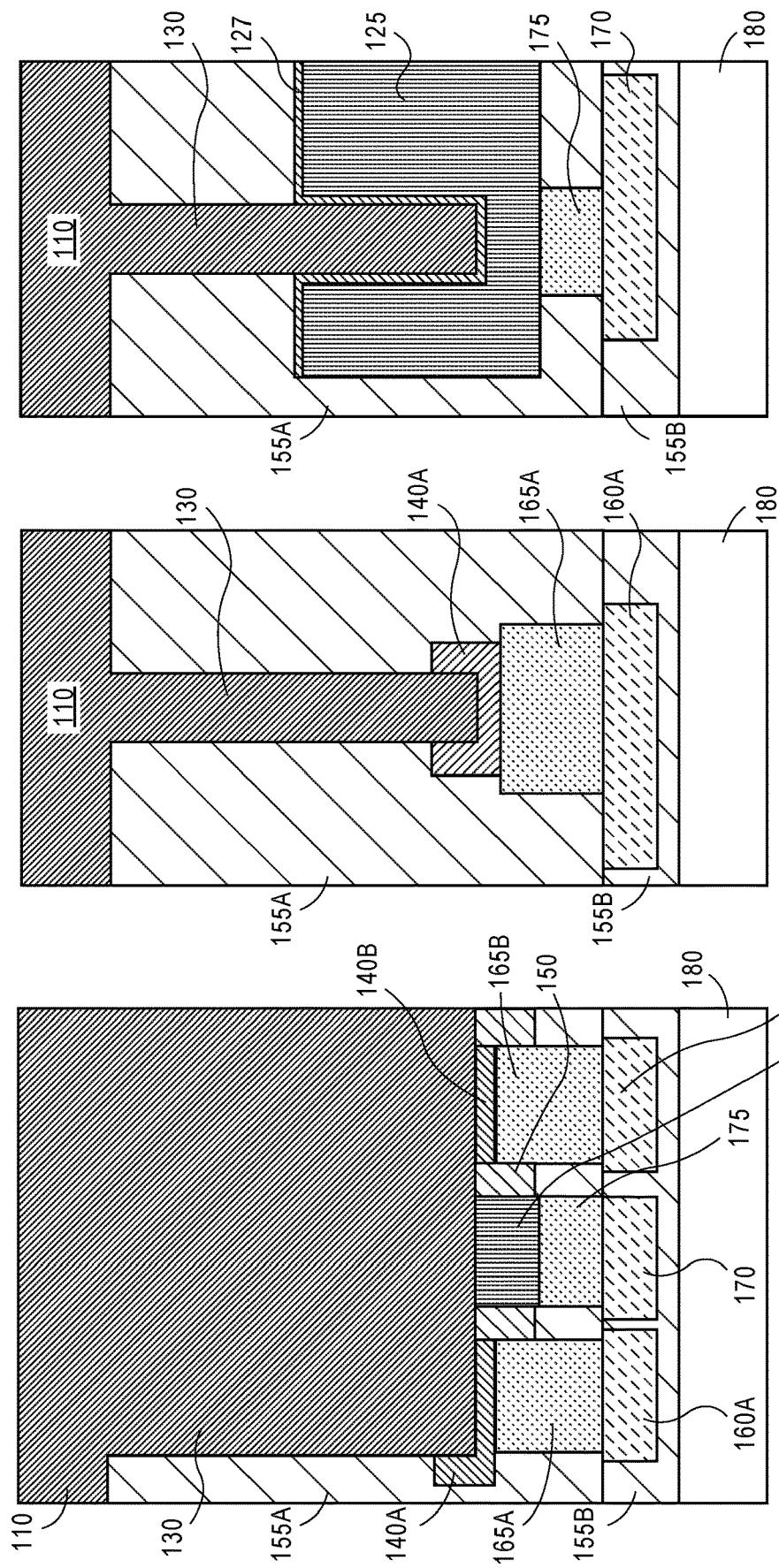

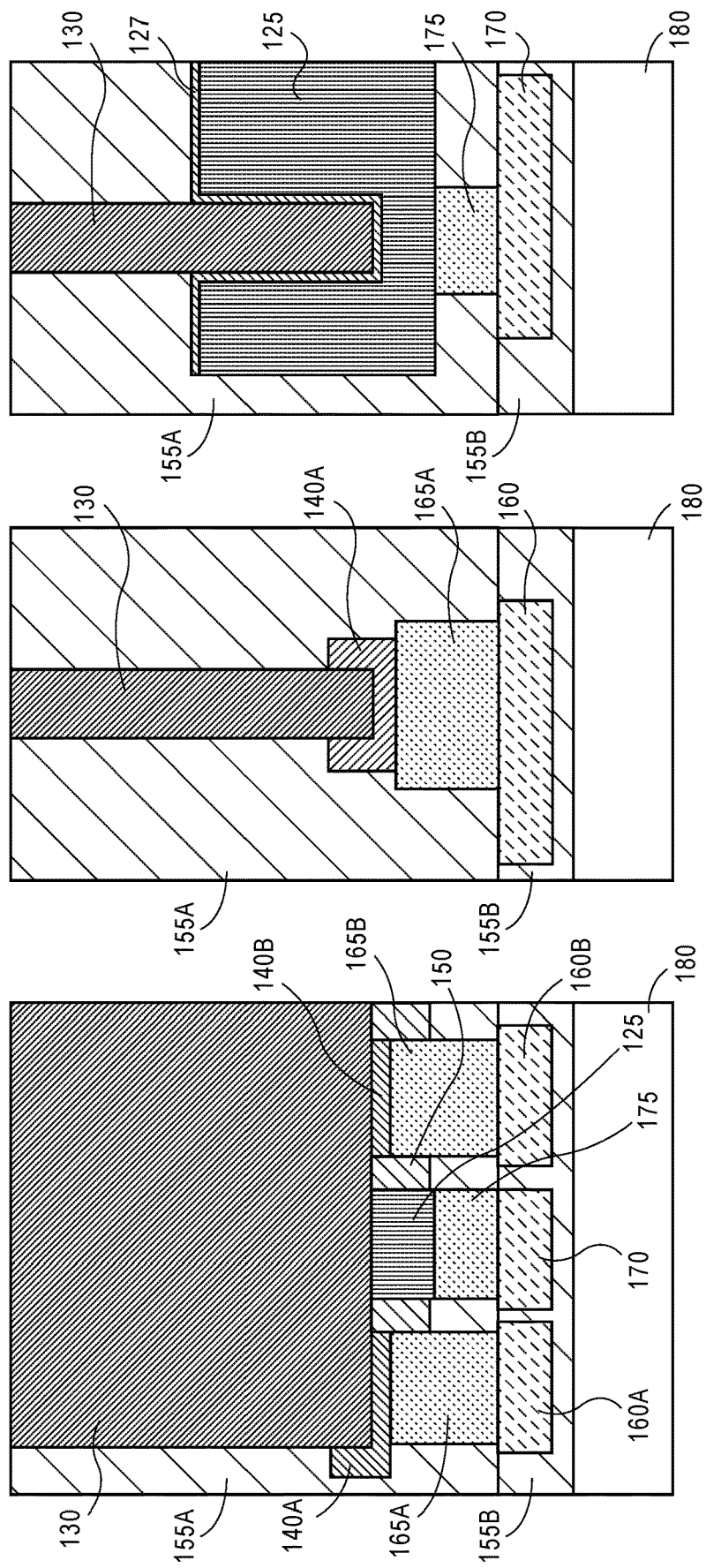

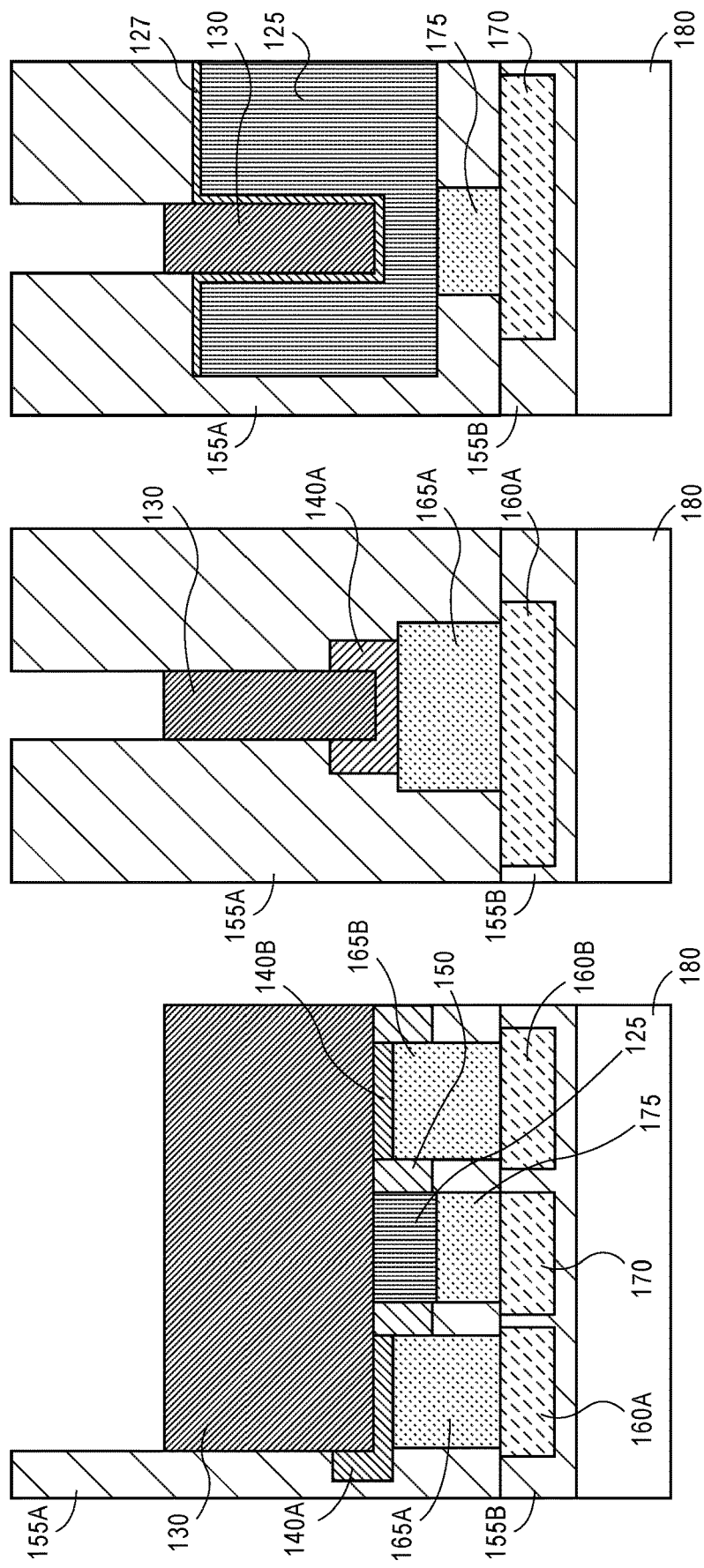

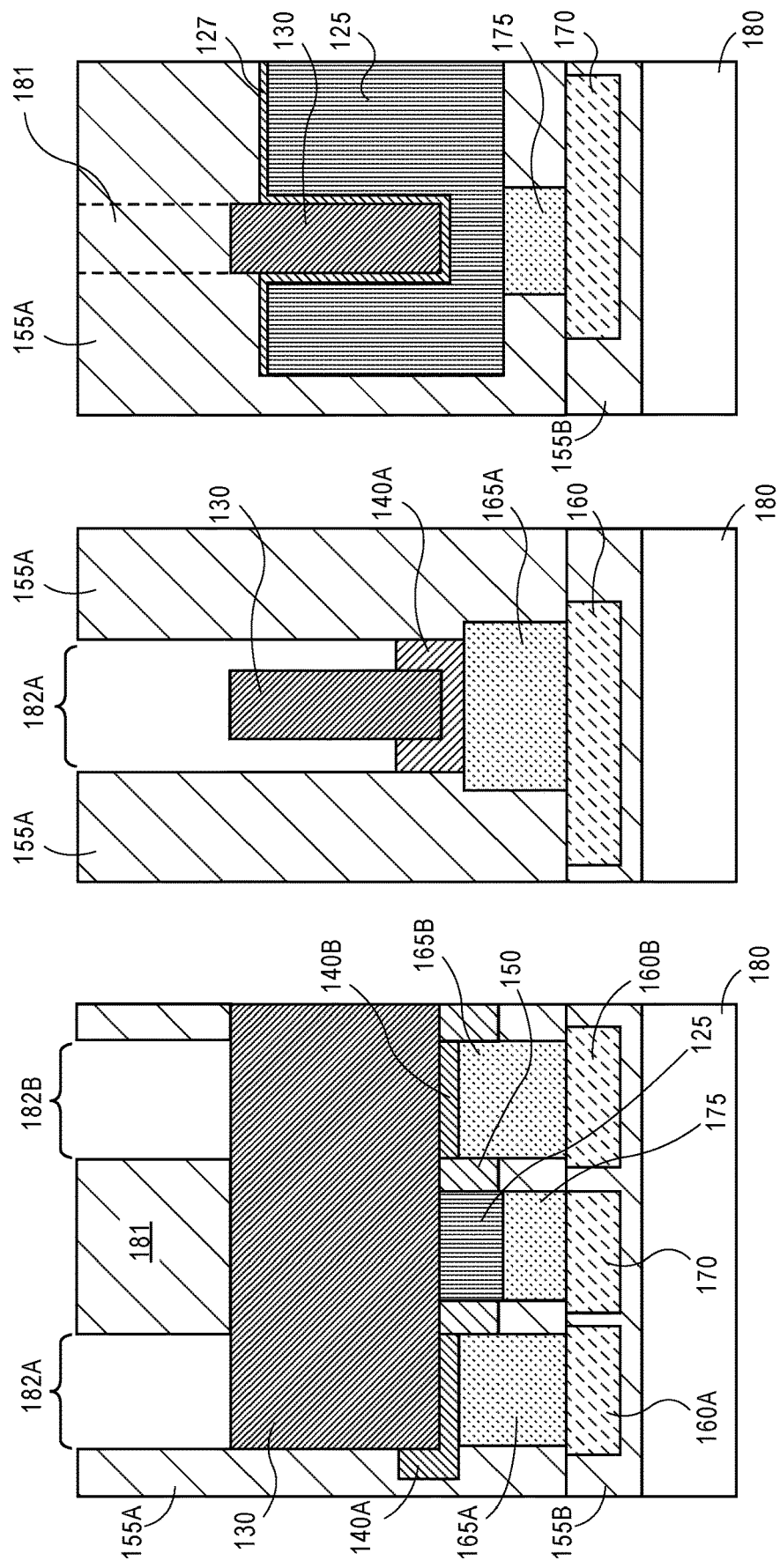

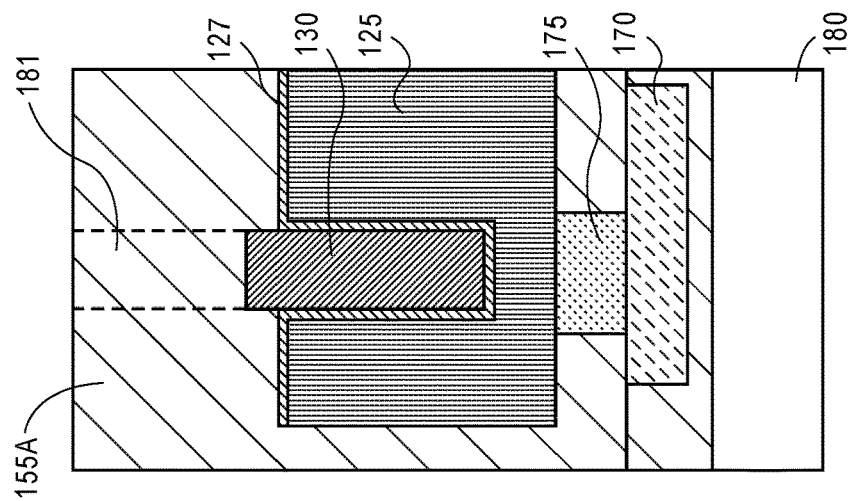
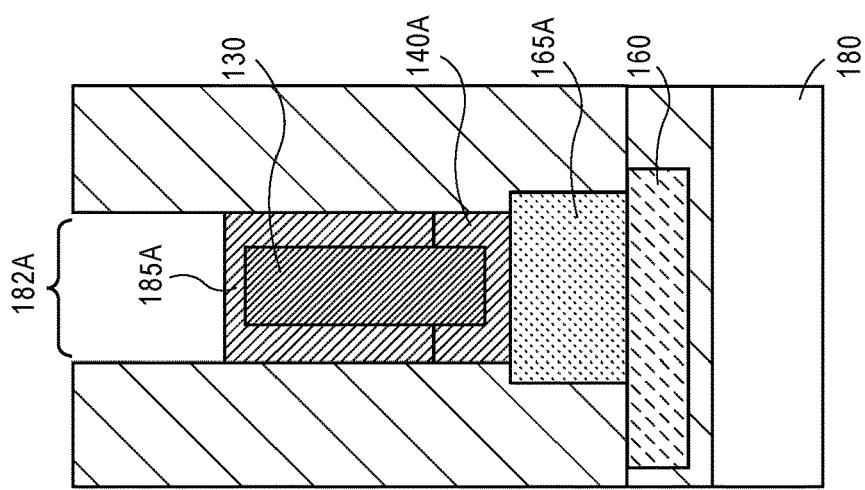
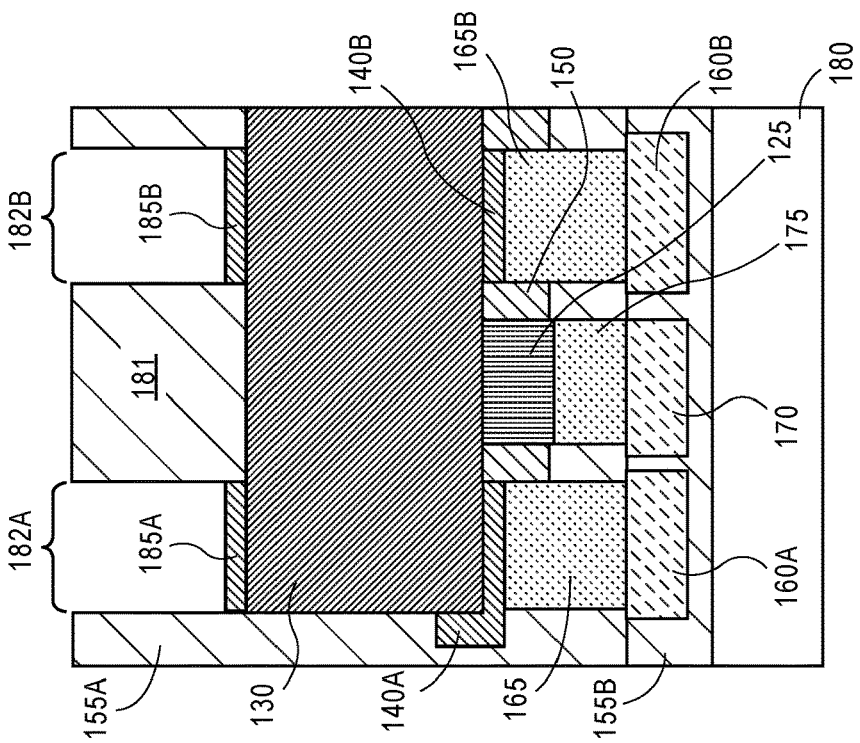
FIG. 9C
FIG. 9B
FIG. 9A

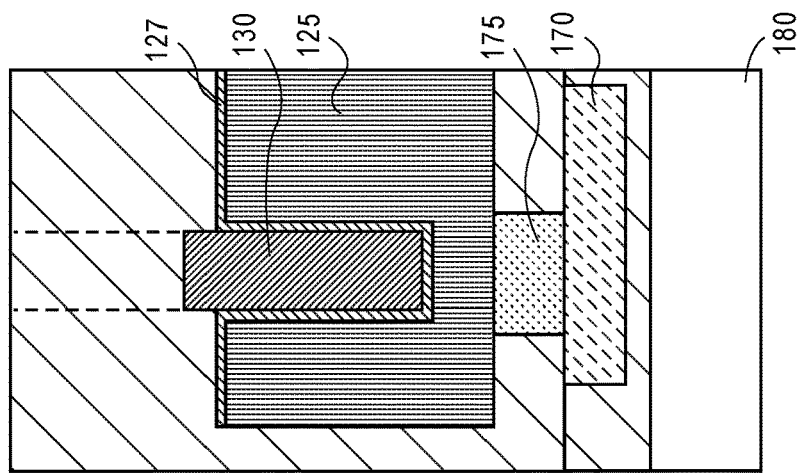
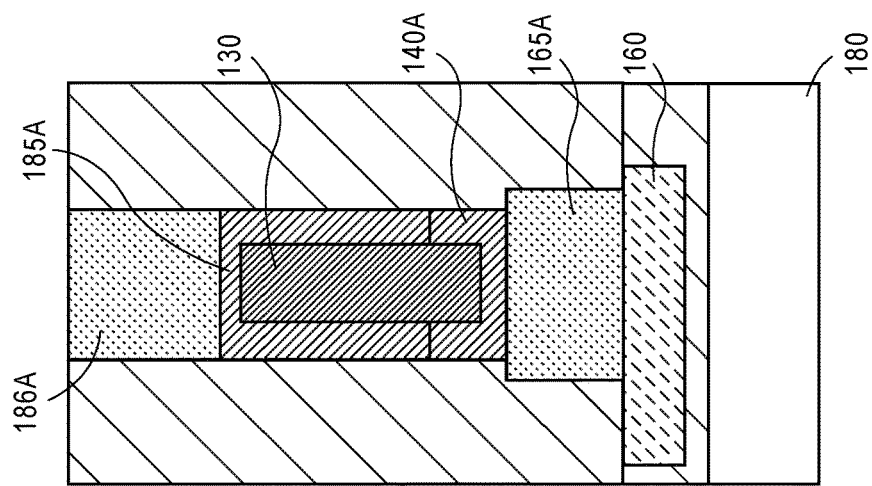
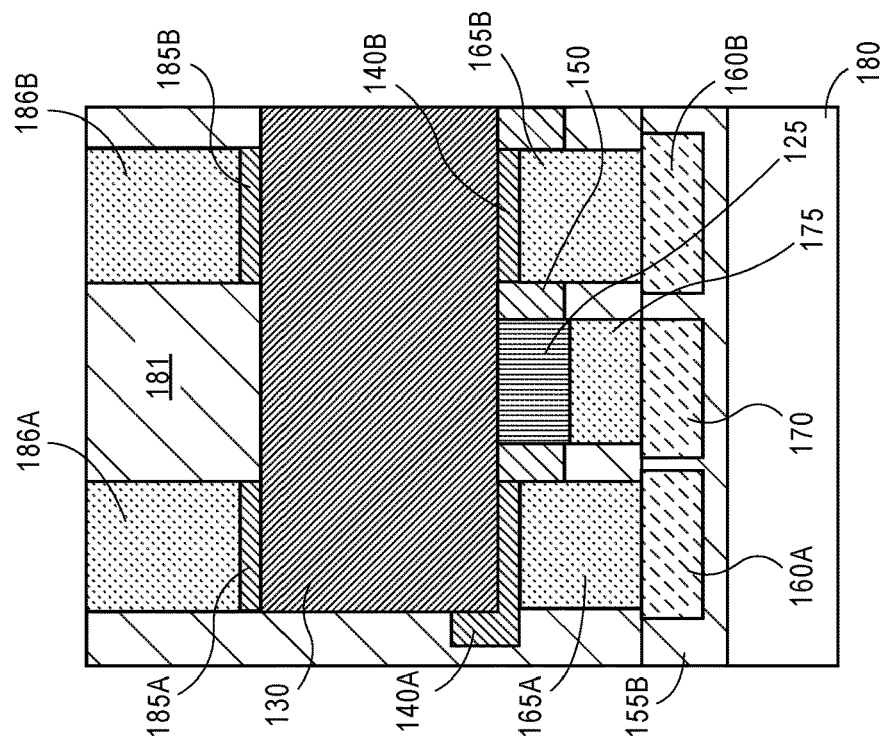
FIG. 10C
FIG. 10B
FIG. 10A

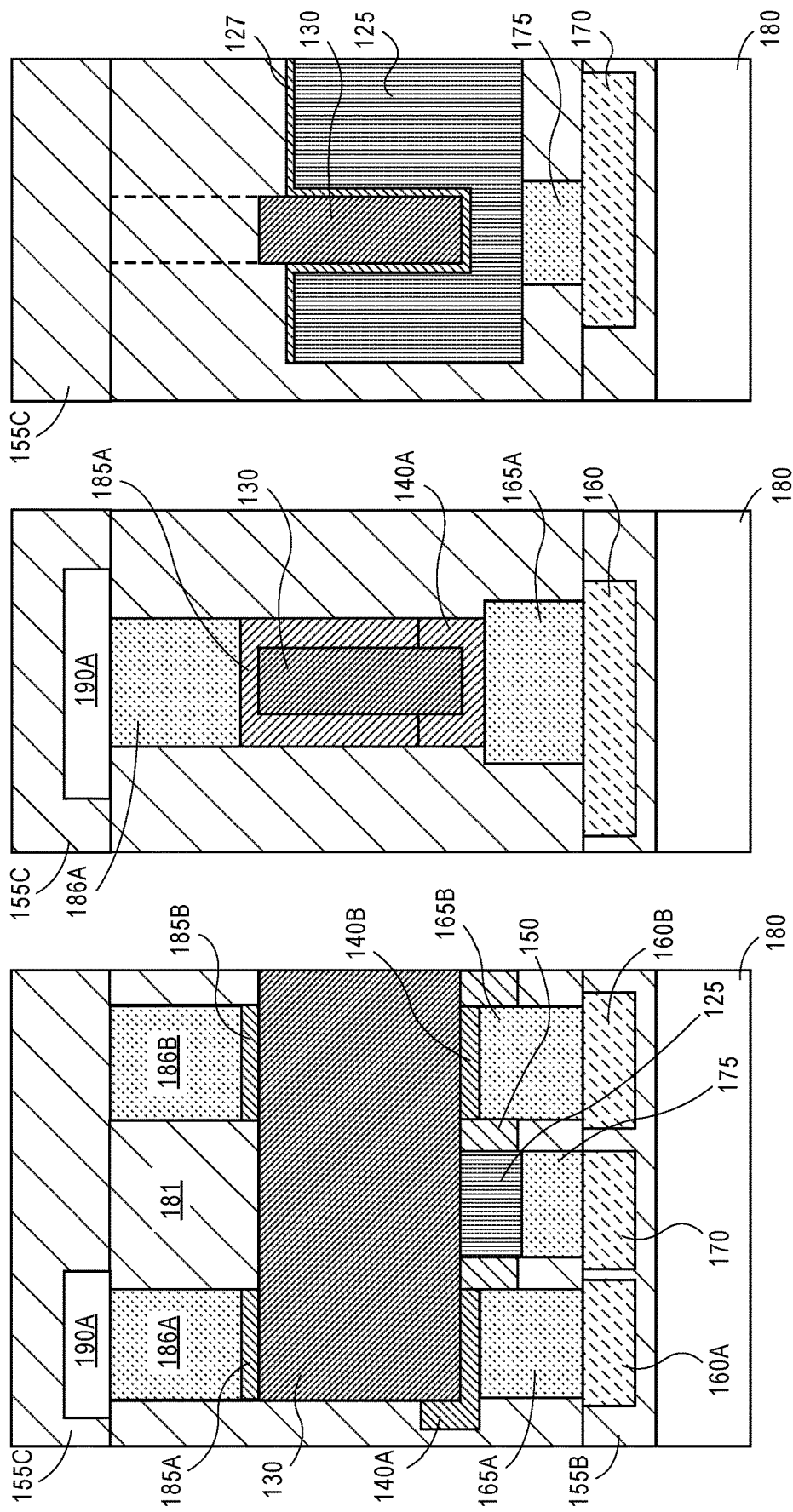

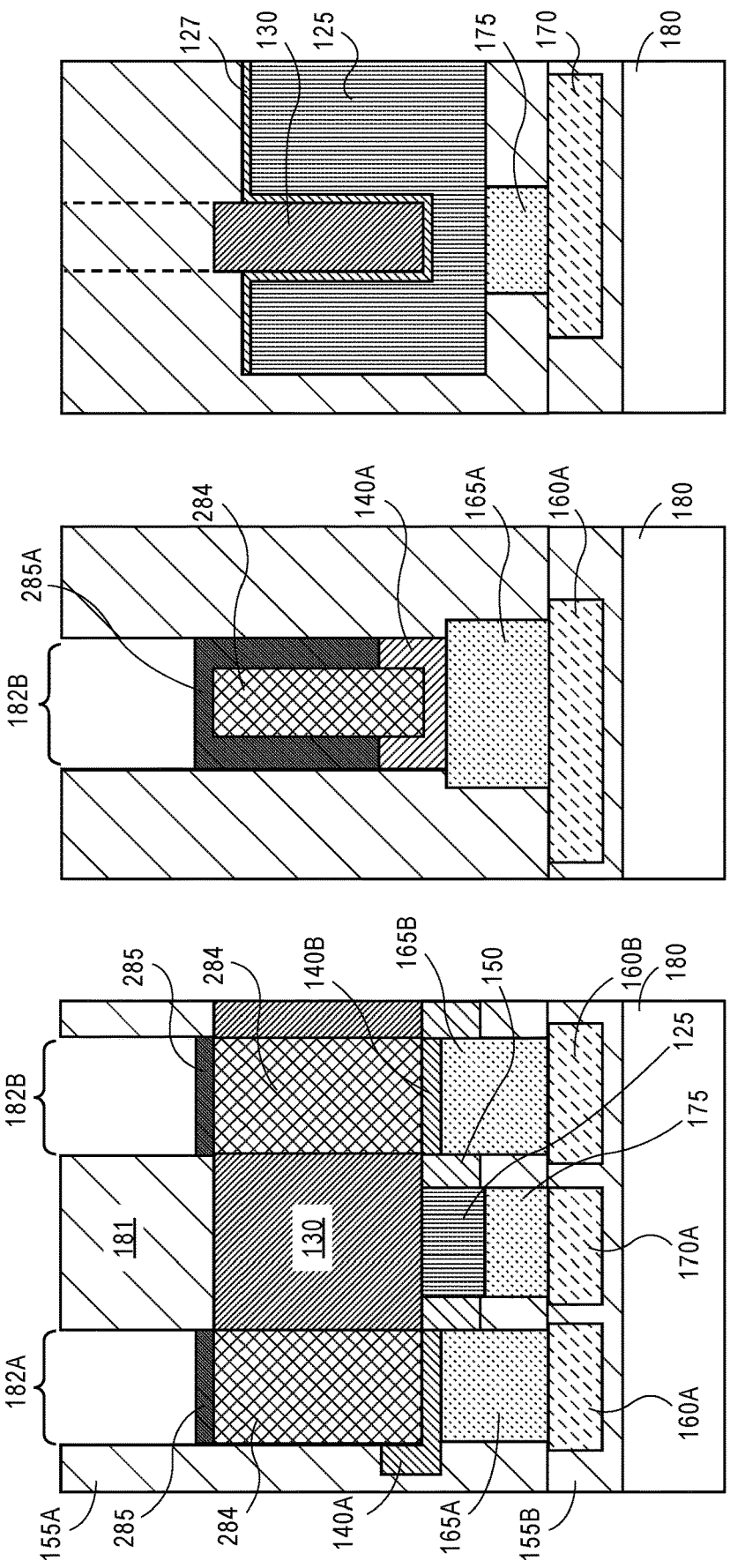

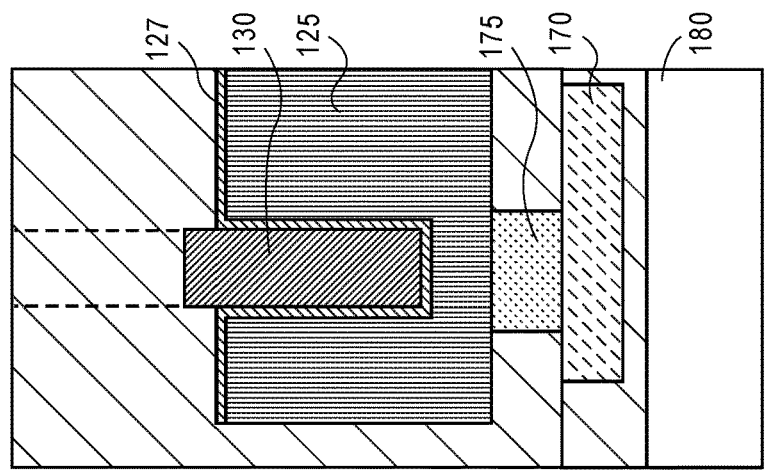
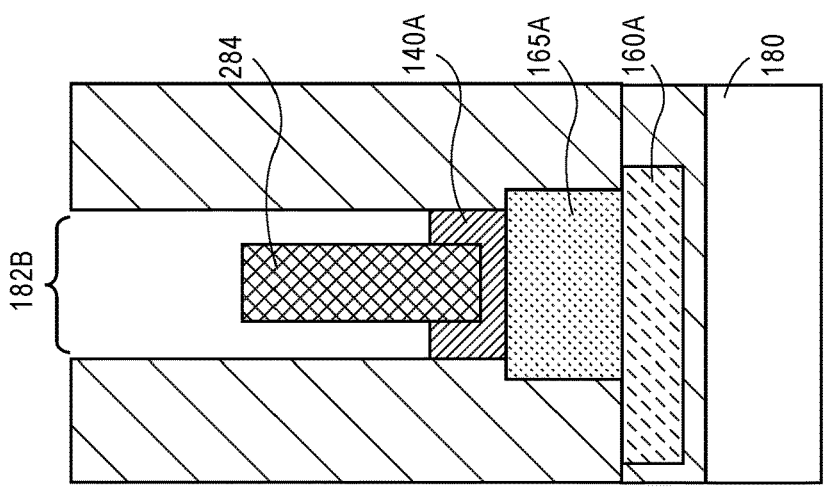
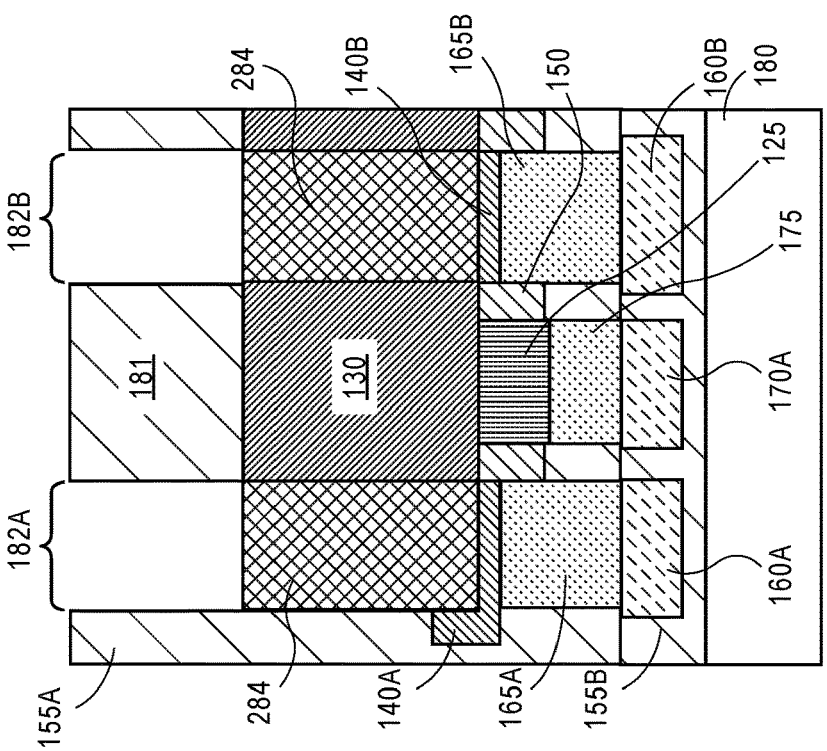

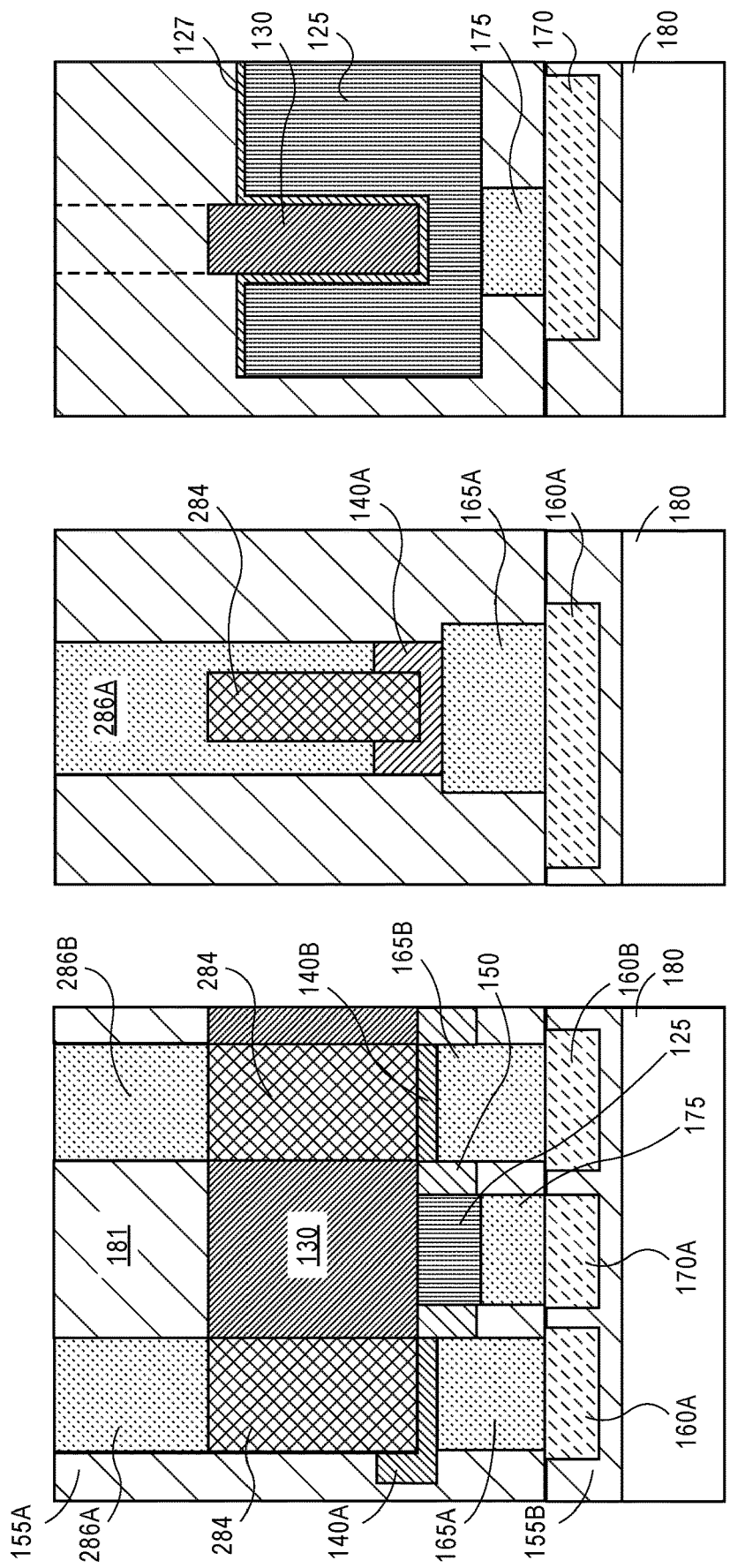

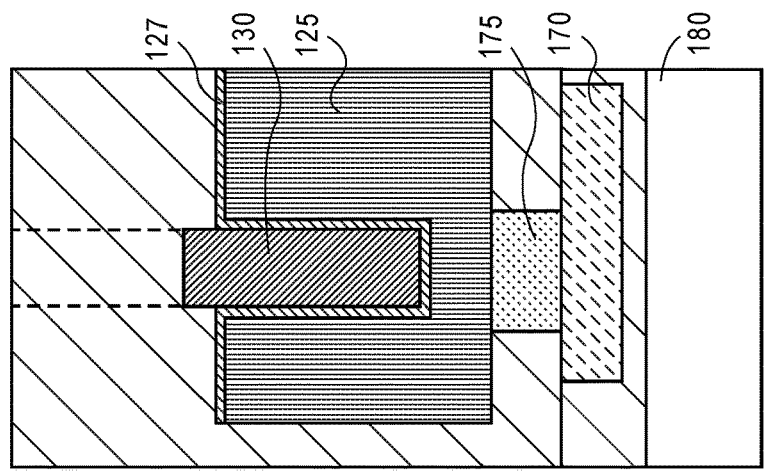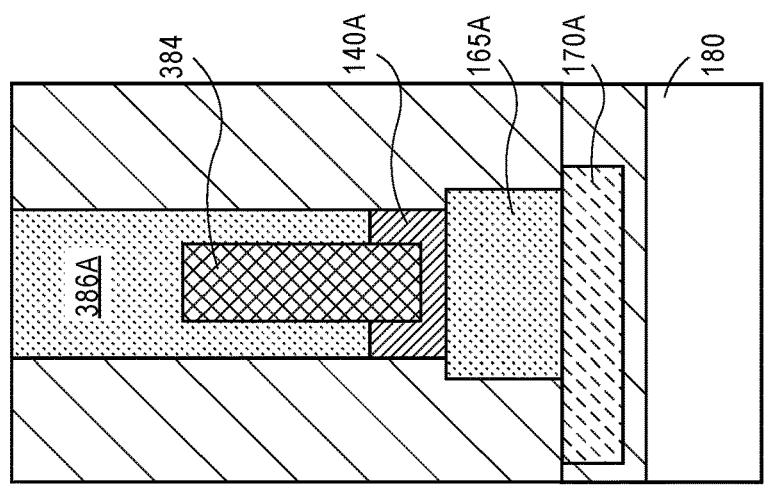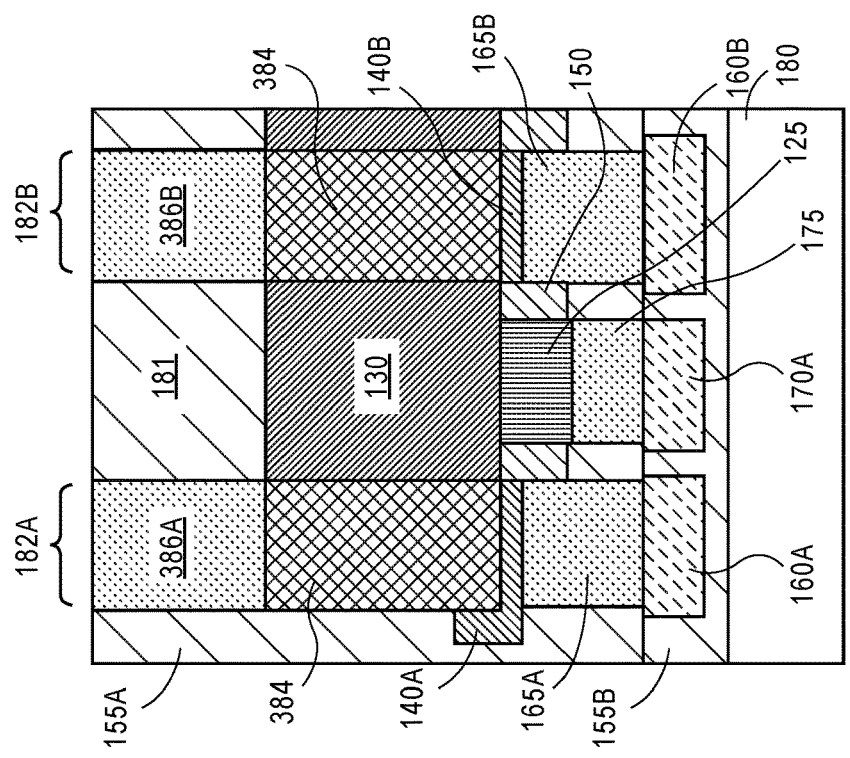

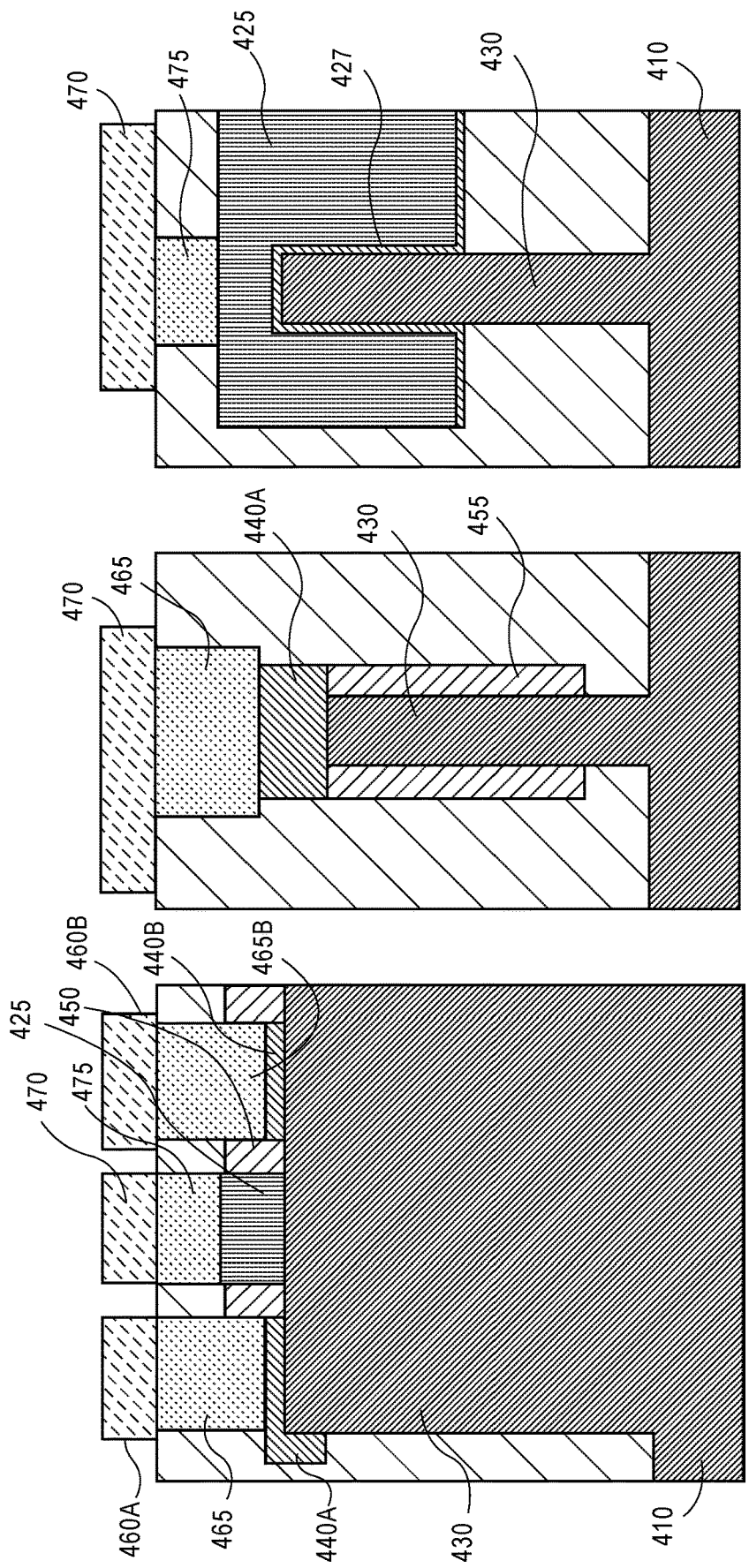

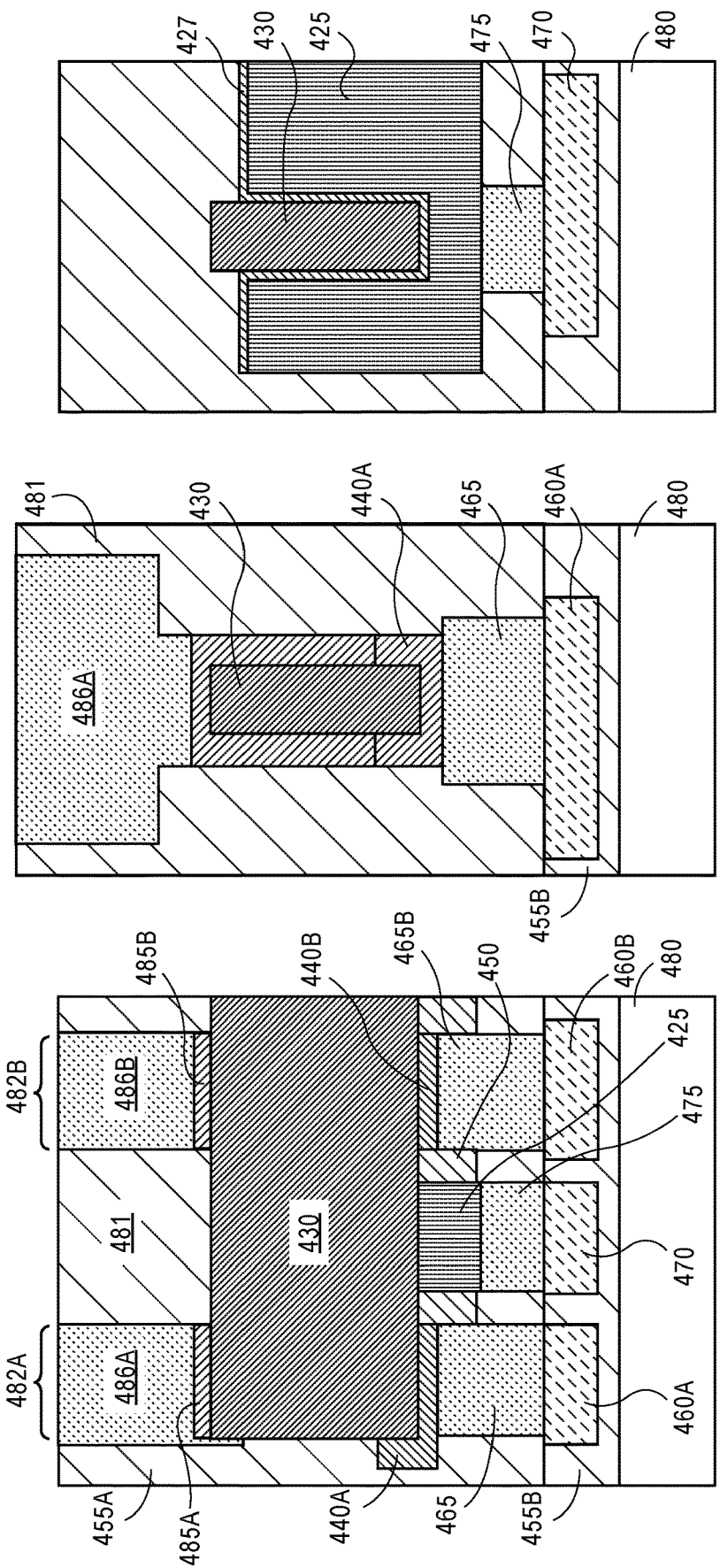

BACKSIDE CONTACT STRUCTURES AND FABRICATION FOR METAL ON BOTH SIDES OF DEVICES

CROSS-REFERENCE TO RELATED APPLICATION

This patent application is a divisional of U.S. patent application Ser. No. 15/747,119, filed Jan. 23, 2018, which is a U.S. National Phase Application under 35 U.S.C. § 371 of International Application No. PCT/US2015/052440, filed Sep. 25, 2015, entitled "BACKSIDE CONTACT STRUCTURES AND FABRICATION FOR METAL ON BOTH SIDES OF DEVICES," which designates the United States of America, the entire disclosure of which are hereby incorporated by reference in their entirety and for all purposes.

TECHNICAL FIELD

Semiconductor devices including devices having electrical connections from a backside of the device.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Future circuit devices, such as central processing unit devices, will desire both high performance devices and low capacitance, low power devices integrated in a single dye or chip.

BRIEF DESCRIPTION OF THE DRAWINGS

FIGS. 4A-4C show cross-sectional side views through the structure of FIG. 2.

FIGS. 5A-5C show the structure of FIG. 3 following the inverting or flipping of the structure and connection of the structure to a carrier.

FIGS. 6A-6C show the structure of FIGS. 5A-5C following the removal or thinning of the transistor device substrate to expose a second side or backside of fin of the transistor device.

FIGS. 7A-7C show the recessing of the fin.

FIGS. 8A-8C shows the structure of FIGS. 7A-7C following the deposition and patterning of a dielectric material on a backside of the fin of the transistor device with openings to source and drain regions.

FIGS. 9A-9C show the structure of FIGS. 8A-8C following an epitaxial growth of a material for a backside junction formation in the backside openings to source and drain regions.

FIGS. 10A-10C show the structure of FIGS. 9A-9C following the filling of the via openings in dielectric material 180 with a conductive contact material.

FIGS. 11A-11C shows the structure of FIGS. 10A-10C and show an interconnect connected to the contact to the source of the transistor device as part of a first backside interconnect or metal layer.

FIGS. 13A-13C show the structure of FIGS. 12A-12C following the drive-in of dopants from the epitaxial material into the fin in source and drain regions of the device.

FIGS. 14A-14C show the structure of FIGS. 13A-13C following the optional removal of the epitaxial material after a dopant drive-in process.

FIGS. 15A-15C show the structures of FIGS. 14A-14C following the introduction of contact metal in the regions aligned with source and drain.

FIGS. 17A-17C show the structures of FIGS. 16A-16C following the introduction of contact metal in the regions aligned with the source and drain of the device.

FIGS. 19A-19C show cross-sectional side views through the structure of FIG. 18.

FIGS. 22A-22C show the structure following an epitaxial growth of a material for a backside junction formation and contacts formed on a backside of the device.

DETAILED DESCRIPTION

The embodiments described herein are directed to semiconductor devices including interconnects or wiring below or on a backside of the devices. Such embodiments are achieved by using backside reveal and backside processing. The embodiments described include an apparatus including a circuit structure including a device layer or stratum including a plurality of devices having a first side and an opposite second side and a metal interconnect connected to at least one of the plurality of devices from the second side of the stratum. Embodiments for forming such devices are also described including examples of backside epitaxial deposition, backside implant and backside epitaxial deposition and drive-in. Backside reveal processing allows flexibility in the type of connections that can be fabricated.

FIGS. 1-10C describe a method or process of forming a non-planar multi-gate semiconductor device including electrical connections on a non-device side or backside of the structure. In one embodiment, the device is a three-dimensional metal oxide semiconductor field effect transistor (MOSFET) and is an isolated device or is one device in a plurality of nested devices. As will be appreciated, for a typical integrated circuit, both N- and P-channel transistors may be fabricated on a single substrate to form a complimentary metal oxide semiconductor (CMOS) integrated circuit. Furthermore, additional interconnects may be fabricated in order to integrate such devices into an integrated circuit.

In the fabrication of non-planar transistors, such as multi-gate transistors and FinFETs, non-planar semiconductor bodies may be used to form transistors generally capable of full depletion with relatively small gate lengths (e.g., less than about 30 nm). These semiconductor bodies are generally fin-shaped and are, thus, generally referred to as transistor "fins". For example in a tri-gate transistor, the transistor fin has a top surface and two opposing sidewalls formed on a bulk semiconductor substrate or a silicon-on-insulator substrate. A gate dielectric may be formed on the top or superior surface and sidewalls of the semiconductor body and a gate electrode may be formed over the gate dielectric on the top or superior surface of the semiconductor body and adjacent to the gate dielectric on the sidewalls of the semiconductor body. Since the gate dielectric and the gate electrode are adjacent to three surfaces of the semiconductor body, three separate channels and gates are formed. As there are three separate channels formed, the semiconductor body can be fully depleted when the transistor is turned on. With regard to finFET transistors, the gate material and the electrode contact the sidewalls of the semiconductor body, such that two separate channels are formed.

Figure 1:
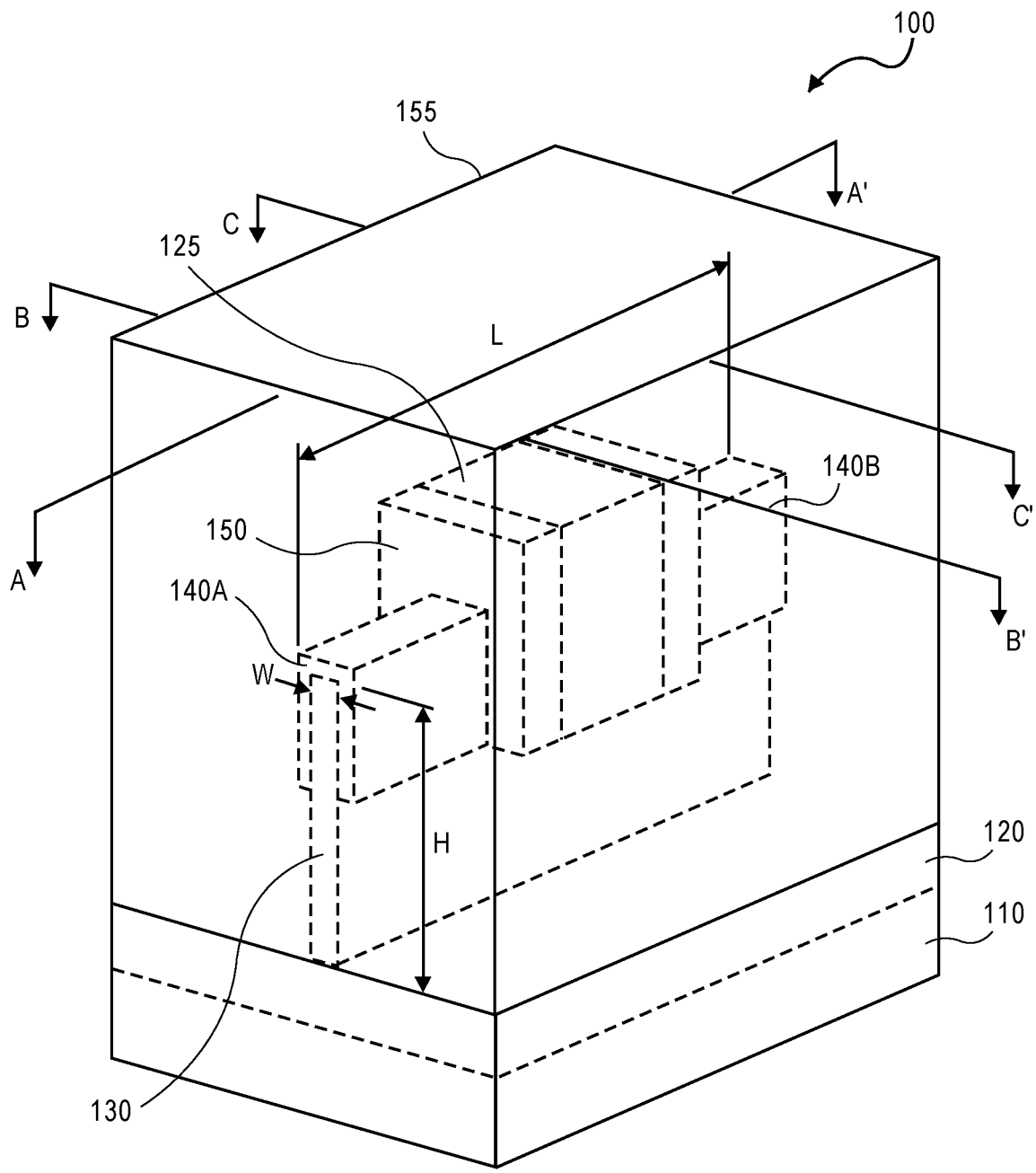
FIG. 1 shows a top side perspective view of a three-dimensional transistor device formed on a fin on a portion of a silicon or silicon-on-insulator (SOI) substrate.

FIG. 1 shows a top side perspective view of a portion of a semiconductor or semiconductor-on-insulator (SOI) substrate that is, for example, a portion of an integrated circuit die or chip on a wafer. Specifically, FIG. 1 shows structure 100 including substrate 110 of silicon or SOI. Overlaying substrate 110 is optional buffer layer 120. In one embodiment, a buffer layer is a silicon germanium buffer introduced, in one embodiment, on substrate 110 by a growth technique. Representatively, buffer layer 120 has a representative thickness on the order of a few hundred nanometers (nm).

Disposed on a surface of substrate 110 and optional buffer layer 120 in the embodiment illustrated in FIG. 1 (an upper surface as viewed), is a portion of a transistor device such as an N-type transistor device or a P-type transistor device. Common to an N-type or P-type transistor device, in this embodiment, is body or fin 130 disposed on a surface of buffer layer 120. In one embodiment, fin 130 is formed of a semiconductor material such as silicon, silicon germanium or a group III-V or group IV-V semiconductor material. In one embodiment, a material of fin 130 is formed according to conventional processing techniques for forming a three-dimensional integrated circuit device. Representatively, a semiconductor material is epitaxially grown on the substrate and then formed into fin 130 (e.g., by a masking and etch process).

In one embodiment, fin 130 has a length dimension, L, greater than a height dimension, H. A representative length range is on the order of 10 nanometers (nm) to 1 millimeter (mm), and a representative height range is on the order of 5 nm to 200 nm. Fin 130 also has a width, W, representatively on the order of 4-10 nm. As illustrated, fin 130 is a three-dimensional body extending from or on a surface of substrate 110 (or optionally from or on buffer layer 120). The three-dimensional body as illustrated in FIG. 1 is a rectangular body with opposing sides (first and second sides) projecting from a surface of buffer layer 120 as viewed. It is appreciated that in processing of such bodies, a true rectangular form may not be achievable with available tooling, and other shapes may result. Representative shapes include, but are not limited to, a trapezoidal shape (e.g., base wider than top) and an arch shape.

Disposed on fin 130 in the embodiment of a structure of FIG. 1 is a gate stack. In one embodiment, a gate stack includes a gate dielectric layer of, for example, silicon dioxide or a dielectric material having a dielectric constant greater than silicon dioxide (a high k dielectric material). Disposed on the gate dielectric layer, in one embodiment, is gate 125 of, for example, a metal. The gate stack may include spacers 150 of dielectric material on opposite sides thereof. A representative material for spacers 150 is a low k material such as silicon nitride (SiN) or silicon carbon nitrogen (SiCN). FIG. 1 shows spacers 150 adjacent the sidewalls of the gate stack and on the fin 130. Formed on or in fin 130 on opposite sides of the gate stack are junction regions (source 140A and drain 140B).

In one embodiment, to form the three-dimensional transistor structure, a gate dielectric material is formed on fin 130 such as by way of a blanket deposition followed by a blanket deposition of a sacrificial or dummy gate material. A mask material is introduced over the structure and patterned to protect the gate stack material (gate stack with sacrificial or dummy gate material) over a designated channel region. An etch process is then used to remove the gate stack material in undesired areas and pattern the gate stack over a designated channel region. Spacers 150 are then formed. One technique to form spacers 150 is to deposit a film on the structure, protect the film in a desired area and then etch to pattern the film into desired spacer dimensions.

Following the formation of a gate stack including a sacrificial or dummy gate material on fin 130 and spacers 150, junction regions (source and drain) are formed on or in fin 130. The source and drain are formed in fin 130 on opposite sides of the gate stack (sacrificial gate electrode on gate dielectric). In the embodiment shown in FIG. 1, source 140A and drain 140B are formed by epitaxially growing source and drain material as a cladding on a portion of fin 130. Representative material for source 140A and drain 140B includes, but is not limited to, silicon, silicon germanium, or a Group III-V or Group IV-V compound semiconductor material. Source 140A and drain 140B may alternatively be formed by removing portions of the fin material and epitaxially growing source and drain material in designated junction regions where fin material was removed.

Following the formation of source 140A and drain 140B, in one embodiment, the sacrificial or dummy gate is removed and replaced with a gate electrode material. In one embodiment, prior to removal of the sacrificial or dummy gate stack, a dielectric material is deposited on the structure. In one embodiment, dielectric material is silicon dioxide or a low k dielectric material deposited as a blanket and then polished to expose sacrificial or dummy gate 125. The sacrificial or dummy gate and gate dielectric are then removed by, for example, an etch process.

Following a removal of the sacrificial or dummy gate and gate dielectric, a gate stack is formed in a gate electrode region. A gate stack is introduced, e.g., deposited, on the structure including a gate dielectric and gate electrode. In an embodiment, gate electrode 125 of the gate electrode stack is composed of a metal gate and a gate dielectric layer is composed of a material having a dielectric constant greater than a dielectric constant of silicon dioxide (a high-K material). For example, in one embodiment, gate dielectric layer 127 (see FIGS. 2A-2C) is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In one embodiment, gate electrode 125 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. Following the formation of the gate stack, additional dielectric material dielectric material of silicon dioxide or a low k dielectric material is deposited on the three-dimensional transistor device (e.g., on ILD0) to encapsulate or embed the device structure in dielectric material. FIG. 1 shows dielectric material 155A encapsulating the three-dimensional transistor device (e.g., as an ILD0).

FIGS. 2A-2C show cross-sectional side views through FIG. 1. More specifically, FIG. 2A shows a cross-sectional side view through line A-A' of FIG. 1 which is a cross-section through fin 130; FIG. 2B shows a cross-section through line B-B' which is a cross-section through source 140A; and FIG. 2C shows a cross-section through line C-C' which is a cross-section through gate electrode 125. The same orientation of cross-sections (A-C) will be presented throughout this description. FIG. 3 shows the structure of FIG. 1 following the forming of interconnects to the three-dimensional transistor device structure. In this embodiment, an electrical connection is made as a first interconnect layer or metal layer to source 140A, drain 140B and gate electrode 125. Representatively, to form individual electrical contacts to source 140A, drain 140B and gate electrode 175, openings are initially formed to the source and gate electrode by, for example, a masking process with openings to each of source 140A, drain 140B and gate electrode 125. The dielectric material is etched to expose the source and gate electrode and then the masking material removed. Next, a contact material of, for example, tungsten is introduced in the openings and the openings are filled to form contact 165A to source 140A, contact 165B to drain 140B and contact 175 to gate electrode 125. A surface of dielectric material 155 (a top surface as viewed) may then be seeded with a conductive seed material and then patterned with masking material to define openings for interconnect paths with respective openings exposing contact 165A, contact 165B and contact 175. A conductive material such as copper is then introduced by way of an electroplating process to form interconnect 160A connected to contact 165A to source 140A, interconnect 160B connected to contact 165B and interconnect 170 connected to contact 175 of gate electrode 125. The masking material and unwanted seed material can then be removed. Following the formation of interconnects as an initial metal layer, dielectric material 155B of for example, silicon dioxide or a low k dielectric material may be deposited as an ILD1 layer on and around the interconnects. Additional interconnect layers may then be formed according to conventional processes.

Figure 2:
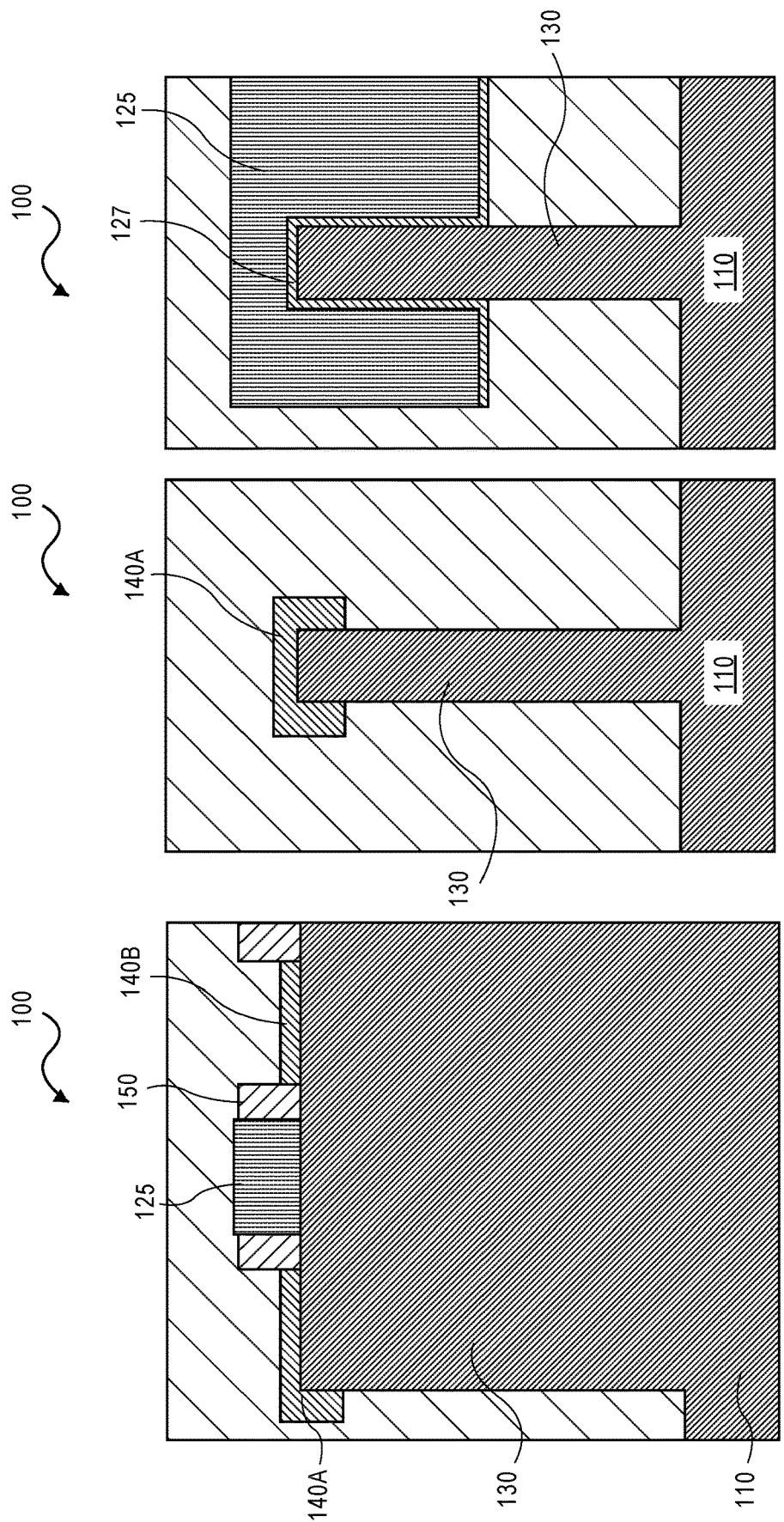
FIGS. 2A-2C show cross-sectional side views through FIG. 1.
Figure 3:
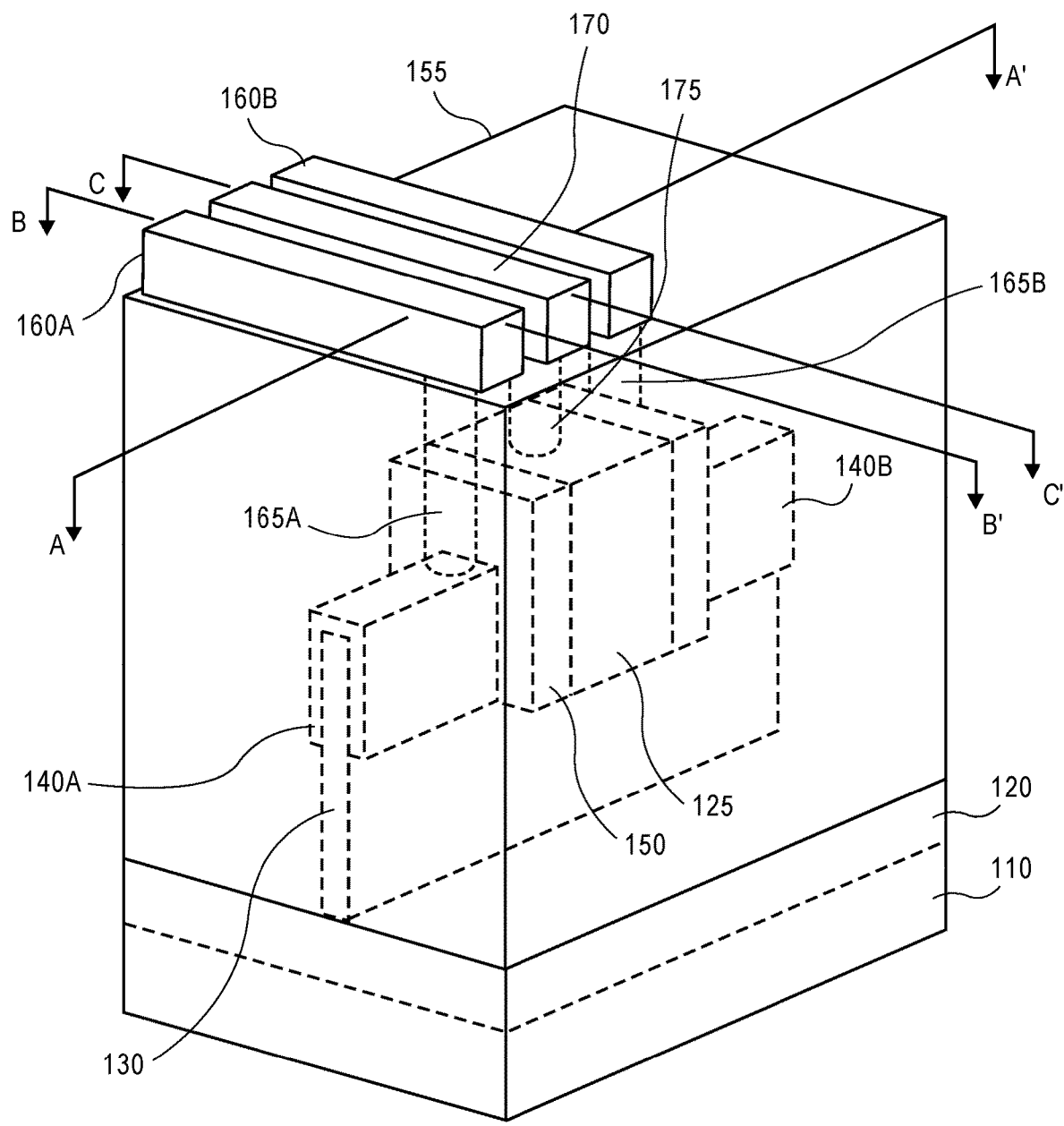
FIG. 3 shows the structure of FIG. 1 following the forming of contacts and interconnects to the three-dimensional transistor device structure.

FIGS. 4A-4C show cross-sectional side views through the structure of FIG. 2. Specifically, FIG. 4A shows a cross-section through line A-A' through fin 130; FIG. 4B shows a cross-section through line B-B' through source 140A; and FIG. 4C shows a cross-sectional side view through line C-C' through gate electrode 125. In the illustration shown in FIG. 3 and FIGS. 4A-4C, a first level of interconnects is formed and connected to a transistor device on substrate 110. It is appreciated that additional interconnect or metallization levels may be formed on this first level by techniques known in the art. The operations that follow thus contemplate a structure (structure 100) that has one or more levels of interconnects or metallization on a device side of the structure (a device side of a device stratum).

FIGS. 5A-5C show the structure of FIG. 3 following the inverting or flipping of the structure and connection of the structure to a carrier. FIGS. 5A-5C represent cross-sections through fin 130, drain 140B, and gate electrode 125, respectively, as described above with respect to FIGS. 2A-2C and FIGS. 4A-4C. Referring to FIGS. 5A-5C, in this embodiment, structure 100 is flipped and connected to carrier 180. Carrier 180 is, for example, a semiconductor wafer. Structure 100 may be connected to carrier 180 through an adhesive or other bonding technique.

FIGS. 6A-6C show the structure of FIGS. 5A-5C following the removal or thinning of substrate 110 to expose a second side or backside of fin 130. In one embodiment, substrate 110 may be removed by a thinning process, such as a mechanical grinding or etch process. FIGS. 6A-6C show fin 130 exposed from a second side or backside of the structure. Following exposure of fin 130, the fin may optionally be recessed. FIGS. 7A-7C show the structure of FIGS. 6A-6C following a recessing of fin 130. In one embodiment, to recess fin 130, an etch process may be utilized with an etchant selective toward a removal of fin material relative to dielectric material 155A. Alternatively, a masking material may be patterned on a surface of dielectric material 155 (an exposed backside surface) with an opening that exposes fin 130. A material of fin 130 may optionally be removed to recess fin 130 by, for example, an etch process, and then the masking material removed.

FIGS. 8A-8C shows the structure of FIGS. 7A-7C following the deposition and patterning of a dielectric material on a backside of fin 130. FIGS. 8A-8C show dielectric material 181 of, for example, a silicon dioxide or a low K dielectric material deposited by for example, a blanket deposition process. Once deposited, dielectric material 181 may be patterned by, for example, forming a masking material on a surface of dielectric material 180 with openings or vias opposite, for example, source and drain regions on an opposite side of fin 130. FIG. 8A shows opening 182A through dielectric material 181 oriented on a backside of fin 130 corresponding to a source region of the fin (source 140A) and opening 182B through dielectric material 181 oriented to a drain region of the fin (drain 140B). FIG. 8B shows that the openings (e.g., opening 182A) have dimensions for a diameter that is greater than a width dimension of fin 130. In this manner, a backside of fin 130 as well as side walls of fin 130 are exposed. FIG. 8B also shows that the etch proceeds through the structure to expose a backside of source 140A. The patterning of dielectric material to form opening 182A and opening 182B, in one embodiment, such that each opening has a dimension to expose a backside of source 140A and drain 140B, respectively, to allow a material to make contact with the source and drain and representatively allow epitaxial growth thereon as described in the following operations.

FIGS. 9A-9C show the structure of FIGS. 8A-8C following an epitaxial growth of a material for a backside junction formation. FIG. 9A shows epitaxially grown material 185A in opening 182A in a region aligned with a backside of source 140A and epitaxially grown material 185B in opening 182B on fin 130 aligned with a backside of drain 140B. FIG. 9B shows material 185A epitaxially grown on the side walls of fin 130 and connecting with source 140A previously formed on a first side or device side of the structure. In one embodiment, a material for material 185A and material 185B is similar to that of source 140A and drain 140B (e.g., silicon, silicon germanium, or a Group III-V or a Group IV-V compound semiconductor materials).

FIGS. 10A-10C show the structure of FIGS. 9A-9C following the filling of the via openings in dielectric material 180 with a conductive contact material such as a tungsten. FIG. 10A shows contact 186A to epitaxial material 185B associated with source 140A and contact metal 186B to epitaxial material 185B associated with drain 140B. FIG. 10B shows contact metal 186B to epitaxial material 185B. FIGS. 10A and 10B also show the connection to source 140A (via contact material) from opposing sides of the structure (a first side or device side and a backside or second side) respectively. Interconnects may now be formed to contacts 186A and 186B by, for example, the technique described above with respect to device side interconnects (see FIGS. 3 and 4A-4C and the accompanying text). FIGS. 11A-11C shows the structure of FIGS. 10A-10C and show interconnect 190A connected to contact 196A to source 140A as part of, for example, a first backside interconnect or metal layer. FIGS. 11A-11C also show the structure following the deposition of dielectric material 155C of silicon dioxide or a low k dielectric material on the interconnect or metal layer. Following the deposition of dielectric material 155C, one or more additional interconnect levels may be introduced on the dielectric material through, for example, electroplating techniques, and connected to devices or underlying interconnects as known in the art.

Figure 12A:
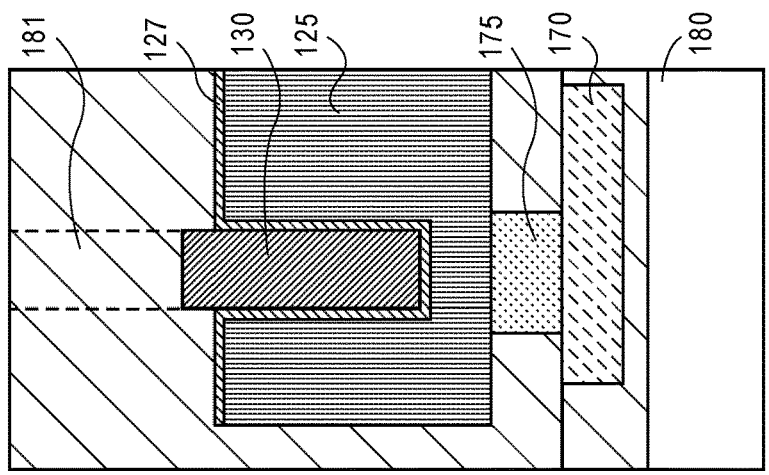
FIGS. 12A-12C show the structure of FIGS. 8A-8C following a deposition of a doped epitaxial material in the openings to source and drain regions according to another embodiment for forming contacts to devices from a backside of such devices.
Figure 12B:
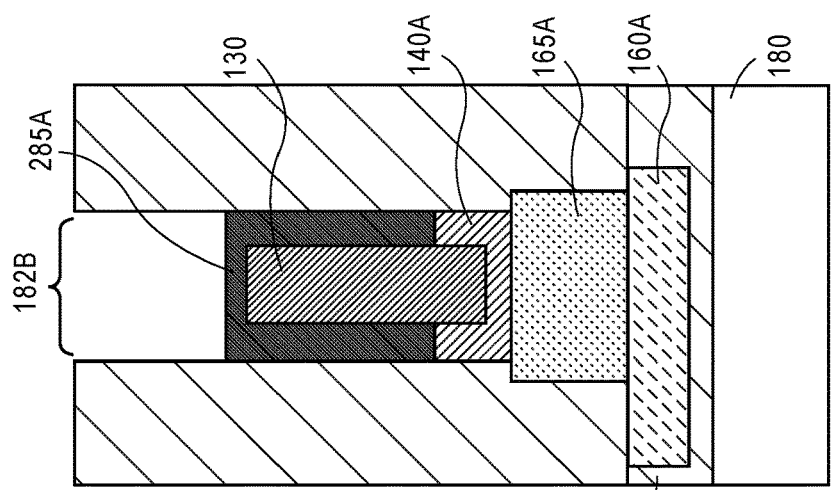
Figure 12C:
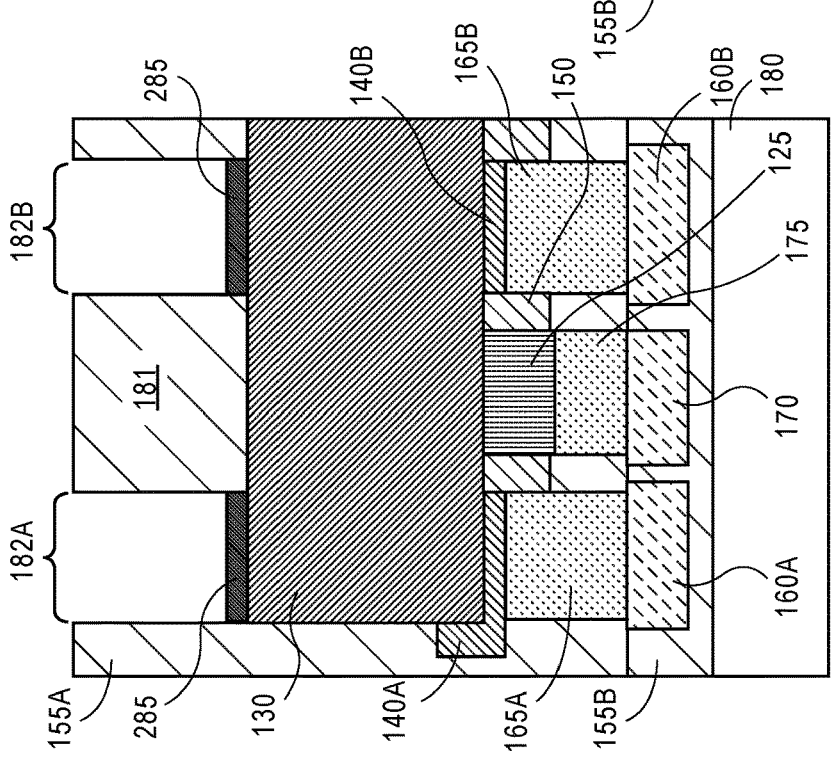

FIGS. 12A-12C illustrate an alternative embodiment for forming contacts to devices from a backside of such devices. In this example, rather than epitaxial deposition in contact areas around the fin, an epitaxial deposition of doped epitaxial material is followed by dopant drive-in to modify portion of the fin in a contact area. FIGS. 12A-12C show the structure of FIGS. 8A-8C described above with respect to the previous embodiment.

FIGS. 13A-13C show epitaxial material 285 introduced in opening 182A of dielectric material 181 and opening 182B of dielectric material 181 aligned on a backside of the device to source 140A and drain 140B, respectively. A suitable material for epitaxial material 285 is a silicon germanium material for a PMOS device and a silicon material for an NMOS device. Other suitable materials for epitaxial material 285 for a PMOS or an NMOS device include silicon, germanium, silicon germanium, silicon-germanium-carbon, carbon-doped silicon (NMOS only), germanium-tin and Group III-V compound semiconductor materials such as gallium arsenide, indium arsenide, indium-gallium arsenide, indium phosphide and gallium nitride.

FIGS. 13A-13C show the structure of FIGS. 12A-12C following the drive-in of dopants from epitaxial material 285 into fin 130 from a backside in regions aligned with source 140A and drain 140B. One technique to drive-in dopants is a thermal process. Representatively, for an epitaxial material of phosphorous-doped silicon (for NMOS) and boron-doped silicon (for PMOS), a thermal drive-in representatively involves heating the structure to a temperature of 800 to 1100° C. for a period sufficient to allow dopants to migrate from the epitaxial material into fine 130. FIGS. 13A-13C show regions of fin 130 modified with dopants 284.

FIGS. 14A-14C show the structure of FIGS. 13A-13C following the optional removal of epitaxial material 285A in opening 182A and opening 182B, respectively, after a dopant drive-in process. FIGS. 15A-15C show the structures of FIGS. 14A-14C following the introduction (e.g., deposition) of contact metal in the regions aligned with and connected to source 140A and drain 140B, respectively. FIG. 15A shows contact metal 286A and contact metal 286B of, for example, tungsten, in contact with modified portions of fin 130 (modified with dopants) where such regions are aligned with source 140A and drain 140B. FIG. 15B shows contact metal 286A disposed along opposite sidewalls of modified portion 284 and in contact with source 140A. After forming contacts, interconnects or metal lines may be formed to the contacts on the backside of the device as described above with respect to FIGS. 11A-11C and the accompanying text.

Figure 16A:
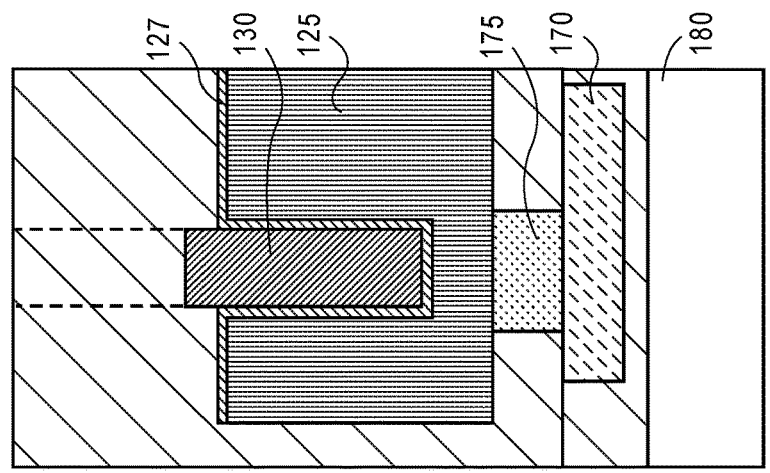
FIGS. 16A-16C show the structure of FIGS. 8A-8C following the introduction of an implant into regions of a fin of the device aligned with source and drain regions according to another embodiment of forming a contact to a device from a backside of a device structure.
Figure 16B:
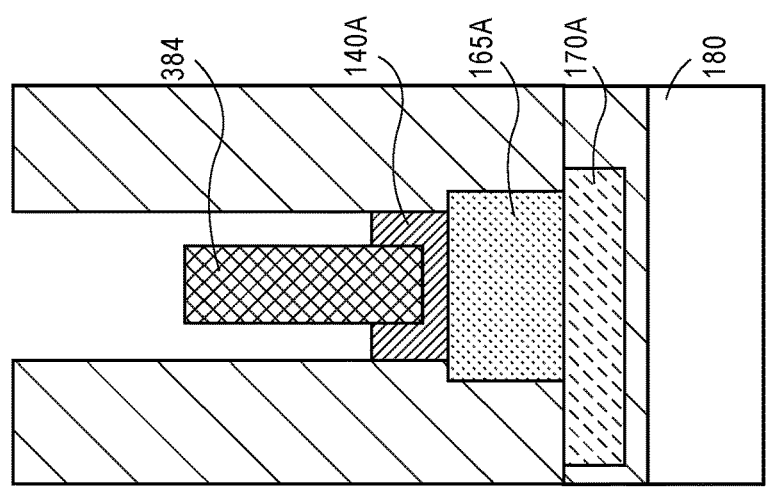
Figure 16C:
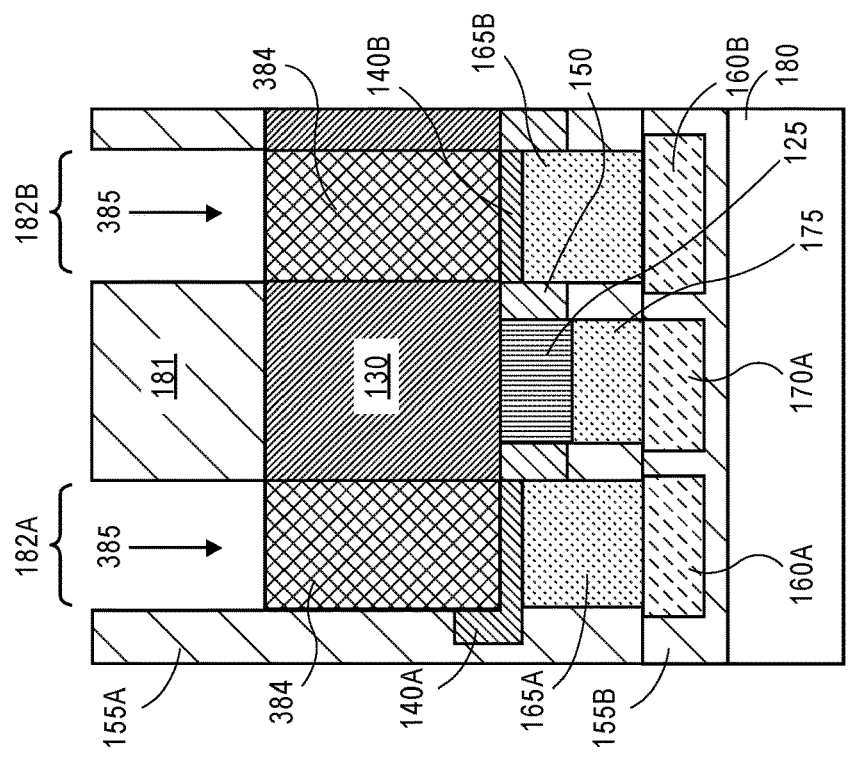

FIGS. 16A-16C describe another embodiment of forming a contact to a device from a backside of a device structure. FIGS. 16A-16C show the structure of FIGS. 8A-8C, respectively, the structure being formed, in one embodiment, according to the operations described up to and including FIGS. 8A-8C. In FIGS. 16A-16C, an implant is introduced from a backside into fin 130 in regions aligned with or opposite (from a backside perspective) source 140A and drain 140B, respectively. FIG. 16A shows an implant process introducing implant material 385 of, for example, arsenic/phosphorous for an NMOS device or boron for a PMOS device.

FIGS. 17A-17C show the structures of FIGS. 16A-16C following the introduction (e.g., deposition) of contact metal in the regions aligned with source 140A and drain 140B. FIG. 17A shows contact metal 386A and contact metal 386B of, for example, tungsten, in contact with modified portions of fin 130 (modified with implants) where such regions are aligned with and connected to source 140A and drain 140B, respectively. FIG. 17B shows contact metal 386A disposed along opposite sidewalls of modified portion 384 and contact with source 140A. After forming contacts, interconnects or metal lines may be formed to the contacts on the backside of the device as described above with respect to FIGS. 11A-11C and the accompanying text.

FIGS. 16A and 16B show fin 130 modified with implant material 384. FIGS. 17A-17C show the structure of FIGS. 16A-16C following the introduction (e.g., deposition) of contact metal in the regions aligned with source 140A and drain 140B and having implant-modified portions of fin 130. FIG. 17A shows contact metal 386A and contact metal 386B of, for example, tungsten, in contact with implant-modified portions of fin 130 where such regions are aligned and connected to source 140A and drain 140B, respectively. FIG. 17B shows contact metal 386A disposed along sidewalls of implant-modified portion 384 of fin 130 and in contact with source 140A. Following the formation of contacts to a backside of the device, interconnects or metal lines may be formed to the contacts as described above in the previous embodiments (see FIGS. 11A-11C and the accompanying text).

Figure 18:
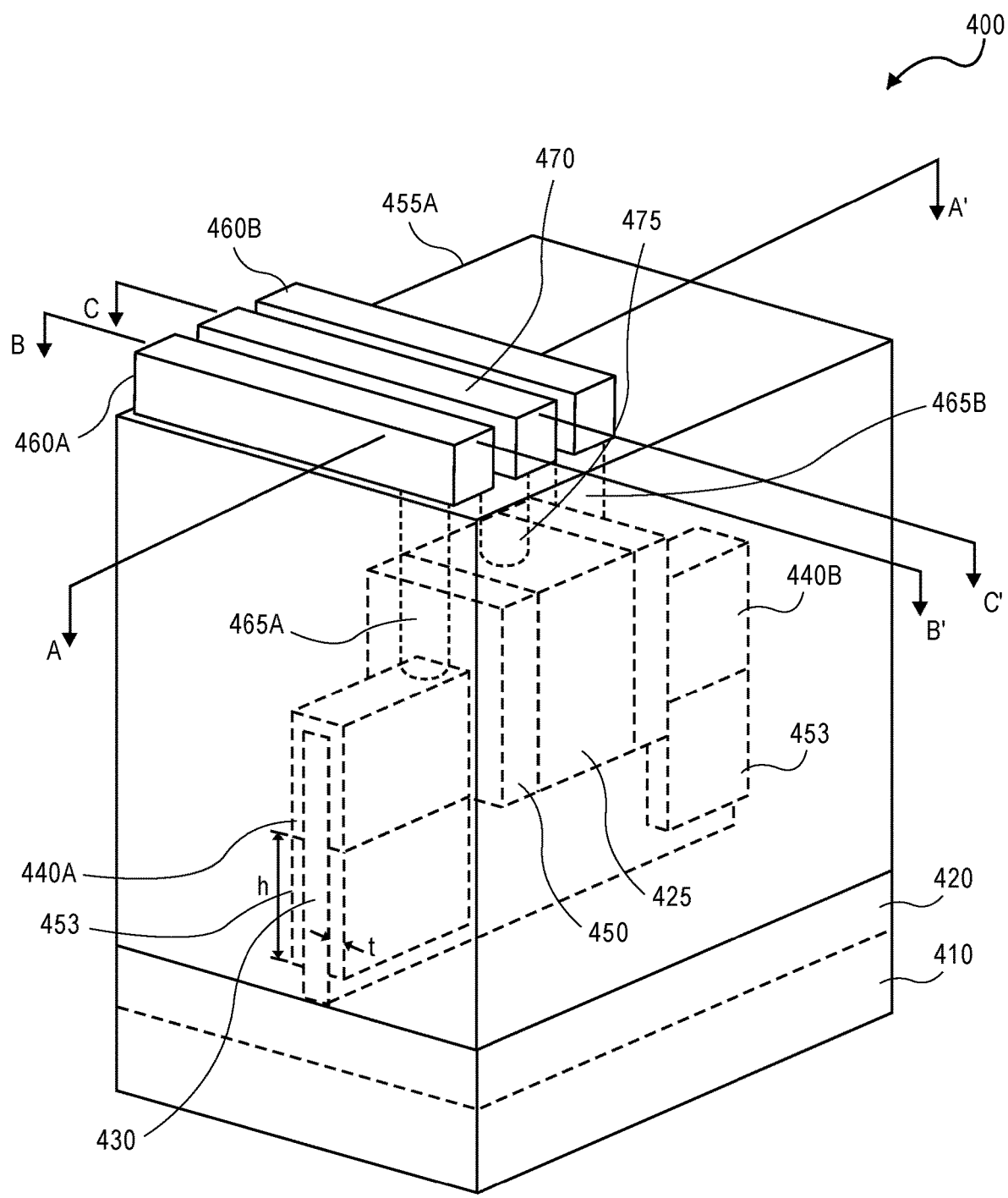
FIG. 18 shows a top side perspective view of three-dimensional transistor device formed on a fin on a portion of a semiconductor or semiconductor-on-insulator (SOI) substrate according to another embodiment where sacrificial material is introduced at a base of the fin in source and drain regions.

FIGS. 18-22C describe another embodiment of a method or process of forming a non-planar multi-gate semiconductor device including electrical connections on a non-device side or backside of the structure. FIG. 18 shows a top side perspective view of a portion of a semiconductor or semiconductor-on-insulator (SOI) substrate that is, for example, a portion of an integrated circuit die or chip on a wafer. Specifically, FIG. 18 shows structure 400 including substrate 410 of silicon or SOI. Overlaying substrate 410 is optional buffer layer 420 such as silicon germanium.

Disposed on a surface of substrate 410 and optional buffer layer 420 in the embodiment illustrated in FIG. 18 (an upper surface as viewed), is a portion of a transistor device such as an N-type transistor device or a P-type transistor device. Common to an N-type or P-type transistor device, in this embodiment, is body or fin 430 disposed on a surface of substrate 410 or on buffer layer 420, if present. In one embodiment, fin 430 is formed of a semiconductor material such as silicon, silicon germanium or a group III-V or group IV-V semiconductor material.

As illustrated, fin 430 is a three-dimensional body extending from or on a surface of substrate 410 (or optionally from or on buffer layer 420) and has a height dimension, H, a length dimension, L, greater than the height dimension and a width dimension. Following a formation of fin 430 from or on substrate 410 or optionally buffer layer 420, sacrificial material 453 is introduced (e.g., deposited) along a portion of opposing sidewalls of the fin. As illustrated in FIG. 18, sacrificial material 453 is disposed on opposing sidewalls of fin 430 in regions along a length dimension designated for junctions (source and drain). Sacrificial material 453 is disposed along a height dimension of fin 430 below a region where junctions are formed on or in the fin. In one embodiment, a three-dimensional transistor device including fin 430 will be embedded in dielectric material such as silicon dioxide or a low K dielectric material. When fin 430 is formed, the fin is exposed. At that point, sacrificial material 453 may be introduced by way of a blanket deposition along a base of fin 430 to a height, h, below portions of fin 430 where junctions are to be formed. A representative height, h, of sacrificial material is on the order of 10 nanometers (nm) to 100 nm. In one embodiment, wherein fin 430 will later be recessed, a layer of dielectric material of silicon dioxide or a low k dielectric may be introduced at a base of fin 430 followed by an introduction of sacrificial material 453. Sacrificial material 453 may ultimately be removed to make connections to the source and drain of the transistor device from a backside of the device. In one embodiment, a material for sacrificial material 453 is a material that meets thermal stability requirement for the processing environment and may be selectively etched relative to a dielectric material (e.g., SiO2) that will ultimately embed the device and a material of fin 430. A representative material for sacrificial material 453 is a dielectric material such as a silicon nitride (SiN) or titanium nitride (TiN). Once sacrificial material 453 is introduced, the material is patterned to a thickness, t, such that when sacrificial material 453 is later removed, sidewalls of fin 430 are exposed from a backside of the structure as is a respective source and drain allowing contact and/or epitaxial growth from the source and drain.

Following the formation of sacrificial material 453 on fin 430, a transistor device may be formed as described above with reference to FIG. 1 and the accompanying text. A transistor device, in this embodiment, includes a gate dielectric layer of, for example, silicon dioxide or a dielectric material having a dielectric constant greater than silicon dioxide (a high k dielectric material) and gate 425 of, for example, a metal disposed on fin 430. The gate stack may include spacers 450 of dielectric material on opposite sides thereof. A representative material for spacers 450 is a low k material such as silicon nitride (SiN) or silicon carbon nitrogen (SiCN). Formed on or in fin 430 on opposite sides of the gate stack are junction regions (source 440A and drain 440B). In this embodiment, source 440A and drain 440B are formed as cladding on a top and sidewalls of fin 430. Source 440A and source 440B have a height dimension along the sidewalls that extends, in one embodiment, to a depth of sacrificial material 453.

FIG. 18 shows structure 400 following the embedding of the transistor device in dielectric material 455A (e.g., ILD0) and the forming of interconnects to the three-dimensional transistor device structure. In this embodiment, an electrical connection is made as a first interconnect layer or metal layer to source 440A, drain 440B and gate electrode 425. FIG. 18 shows a contact material of, for example, tungsten is introduced in openings or vias of dielectric material 455 to form contact 465A to source 440A, contact 465B to drain 440B and contact 475 to gate electrode 425. FIG. 18 also shows a first metal or interconnect line or layer on a surface of dielectric material 455 including interconnect 460A connected to contact 465A to source 440A, interconnect 460B connected to contact 465B and interconnect 470 connected to contact 475 of gate electrode 425. Following the formation of interconnects as an initial metal layer, a dielectric material of for example silicon dioxide or a low k dielectric material may be deposited as an ILD1 layer on and around the interconnects. Additional interconnect layers may then be formed according to conventional processes.

FIGS. 19A-19C show cross-sectional side views through the structure of FIG. 18. Specifically, FIG. 19A shows a cross-section through line A-A' through fin 430; FIG. 19B shows a cross-section through line B-B' through drain 440B; and FIG. 19C shows a cross-sectional side view through line C-C' through gate electrode 425 and shows gate dielectric 427 between gate electrode 425 and fin 430.

Figures 20A, 20B, 20C:
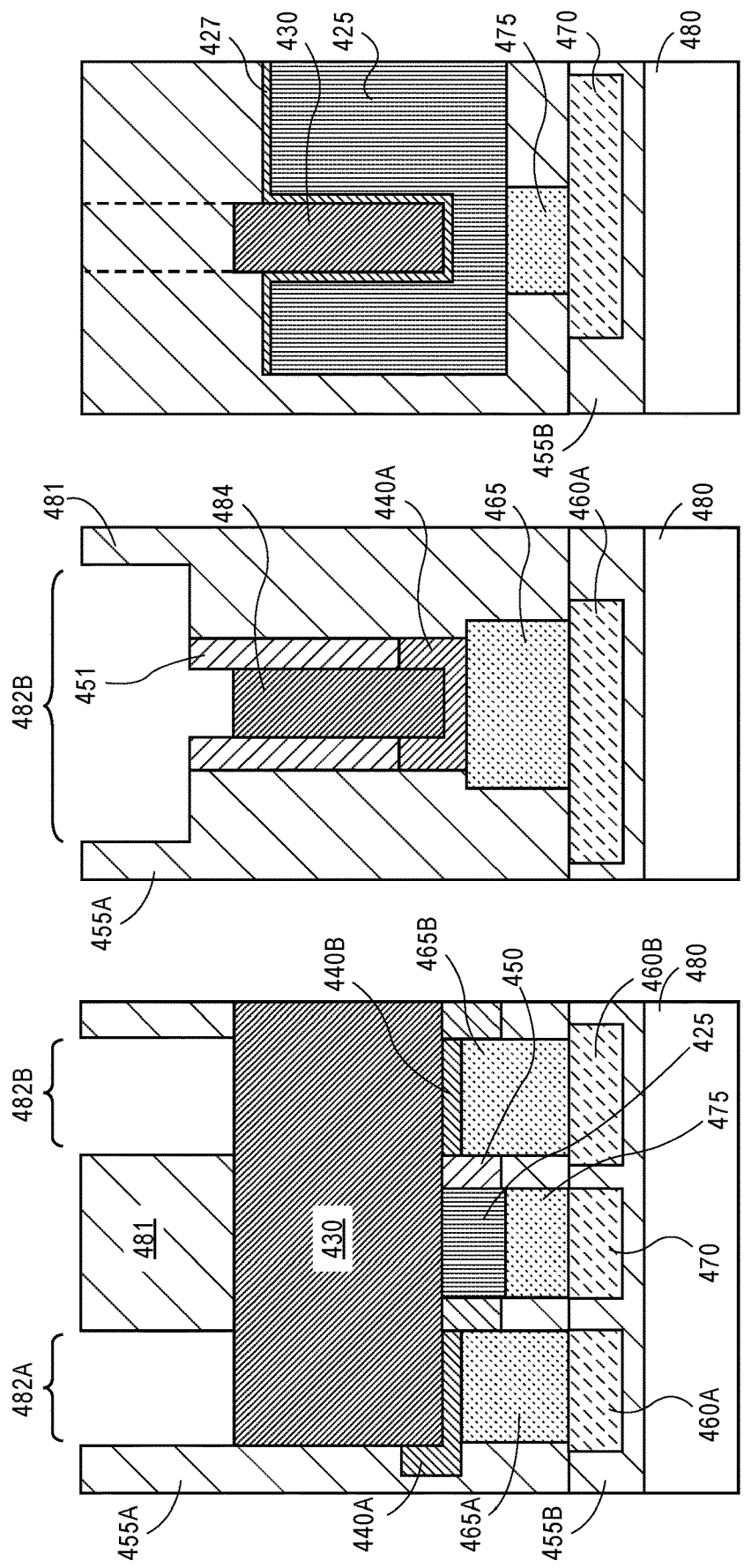
FIGS. 20A-20C show the structure of FIGS. 19A-19C following the introduction of a dielectric material on the first level interconnects; the inverting or flipping of the structure and connection of the structure to a carrier; the thinning of the substrate and recessing of the fin; and the defining of regions of the fin for backside connection to the source and drain of the device.

FIGS. 20A-20C show the structure of FIGS. 19A-19C following the introduction of a dielectric material on the first level interconnects; the inverting or flipping of the structure and connection of the structure to a carrier; the thinning of the substrate and recessing of the fin; and the defining of regions of the fin for backside connection to the source and drain of the device. FIGS. 20A-20C represent cross-sections through fin 430, drain 440B, and gate electrode 425, respectively. Referring to FIGS. 20A-20C, in this embodiment, the first level interconnects are passivated by dielectric material 455B such as silicon dioxide or a low k dielectric material. Structure 400 is then flipped or inverted and connected to carrier 480 such as a semiconductor wafer device side down. Structure 400 may be connected to carrier 480 through an adhesive or other bonding technique between dielectric material 455B and carrier 180.

FIGS. 20A-20C also show the structure of FIGS. 19A-19C following the removal or thinning of substrate 410 by, for example, mechanical grinding or etch process to expose a second side or backside of fin 430. In one embodiment, fin 430 is then optionally recessed.

FIGS. 20A-20C further show the structure following the deposition and patterning of a dielectric material on a backside of fin 430. FIGS. 20A-20C show dielectric material 481 of, for example, a silicon dioxide or a low K dielectric material deposited by for example, a blanket deposition process. Once deposited, dielectric material 481 is patterned by, for example, forming a masking material on a surface of dielectric material 481 with openings or vias opposite, for example, source and drain regions on an opposite side of fin 430. FIG. 20A shows opening 482A through dielectric material 481 oriented on a backside of fin 430 corresponding to a source region of the fin (source 440A) and opening 482B through dielectric material 481 oriented to a drain region of the fin (drain 440B). FIG. 20B shows that the openings (e.g., opening 482A) have dimensions for a diameter that is greater than a width dimension of fin 430. In this manner, a backside of fin 430 as well as sacrificial material 453 are exposed.

Figure 21C:
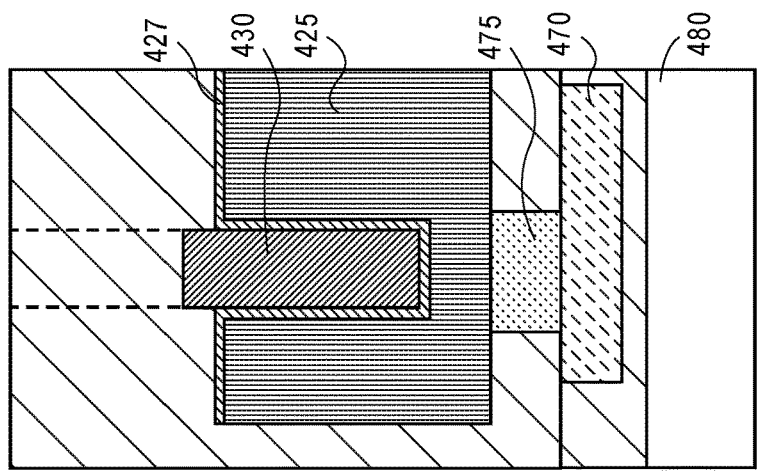
FIGS. 21A-21C show the structure of FIGS. 20A-20C following the removal of the sacrificial material adjacent opposing sidewalls of the fin in source and drain regions.
Figure 21B:
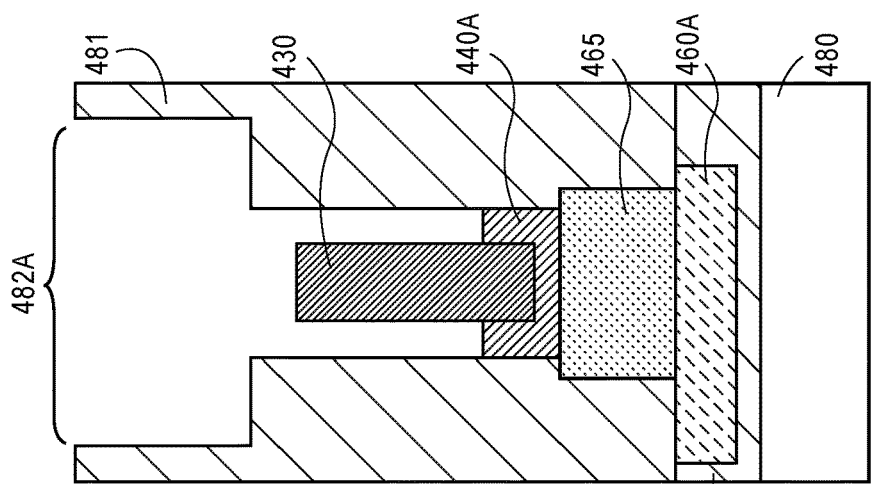
Figure 21A:
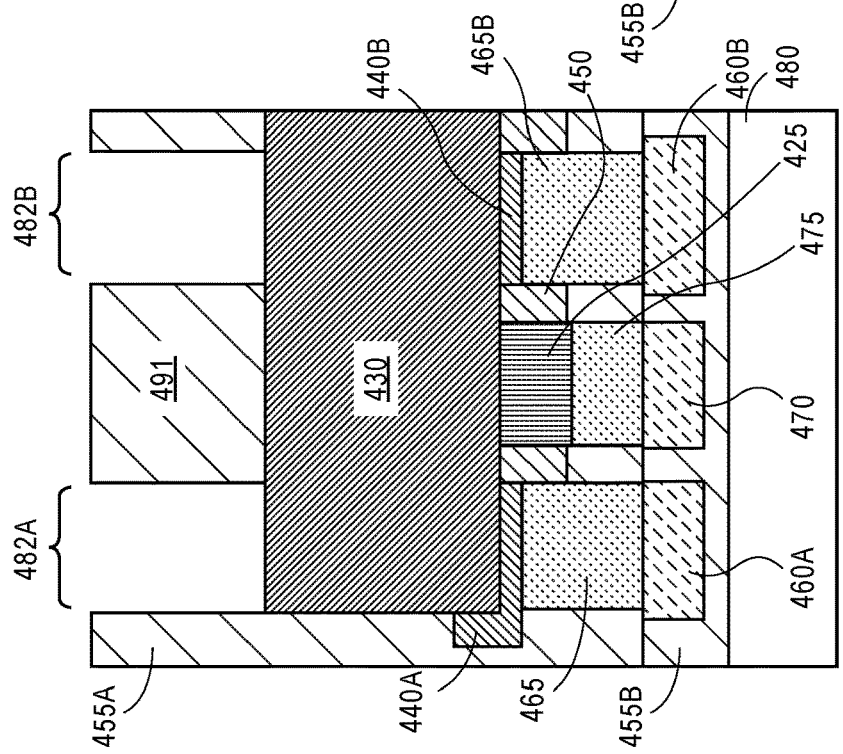

FIGS. 21A-21C show the structure of FIGS. 20A-20C following the removal of sacrificial material 453 adjacent opposing sidewalls of fin 430. In one embodiment, sacrificial material 453 may be removed by an etch process with an etchant selective for sacrificial material 453 relative to dielectric material 455A and 481 and relative to fin 430. FIG. 21B shows that following a removal of sacrificial material 453, a backside of fin 430 is exposed as are sidewalls of fin 430 and source 440A.

FIGS. 22A-22C show the structure following an epitaxial growth of a material for a backside junction formation and contacts formed on a backside of the device. FIG. 22A shows epitaxially grown material 485A in opening 482A in a region aligned with a backside of source 440A and epitaxially grown material 485B in opening 482B on fin 430 aligned with a backside of drain 440B. FIG. 22B shows material 485A epitaxially grown on the side walls of fin 430 and connecting with source 440A previously formed on a first side or device side of the structure. While an epitaxial growth option is presented, it is appreciated that other methods described above (doped epitaxial drive-in (FIGS. 12A-15C), implant (FIGS. 16A-17C)) may alternatively be utilized.

FIGS. 22A-22C show the structure following the filling of the via openings in dielectric material 481 with a conductive contact material such as a tungsten. FIG. 22A shows contact 486A to epitaxial material 485B associated with source 440A and contact metal 486B to epitaxial material 485B associated with drain 440B. FIG. 22B shows contact metal 486B to epitaxial material 485B. FIGS. 22A and 22B also show the connection to source 440A (via contact material) from opposing sides of the structure (a first side or device side and a backside or second side) respectively. Interconnects may now be formed to contacts 486A and 486B by, for example, the technique described above with respect to device side interconnects (see FIGS. 3 and 4A-4C and the accompanying text).

Figure 23:
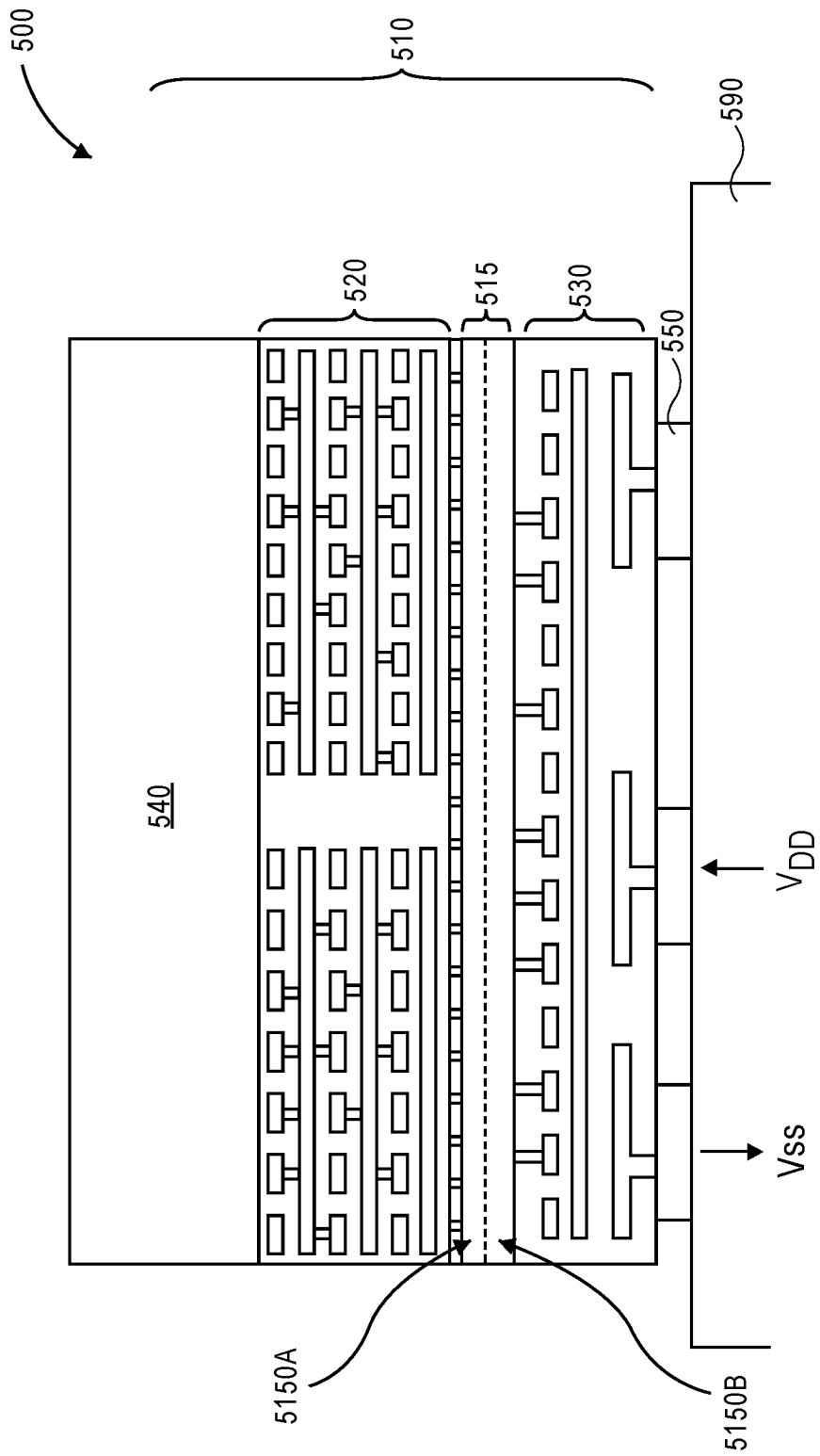
FIG. 23 shows a cross-sectional schematic side view of one embodiment of an assembly including an integrated circuit chip or die connected to a package substrate.

FIG. 23 shows a cross-sectional schematic side view of one embodiment of an assembly including an integrated circuit chip or die connected to a package substrate. Assembly 500 includes die 510 that may be formed as described above with reference to FIGS. 1-22C. Die 510 includes device layer or stratum 515 including a number of devices (e.g., transistor devices). Device stratum 515 includes first side 5150A representing a first side of the stratum and second side or backside 5150B opposite first side 5150A. The transistor devices include, for example, one or more power transistors and logic circuitry. Connected to device stratum 515 of die 510 on a first side are interconnects 520 that, in one embodiment, include, but are not limited to, a number of conductive metal lines connected to devices of device stratum 515 from first side 5150A. With reference to FIG. 3, interconnect 160A, interconnect 160B and interconnect 170 are representative of a first level of interconnects 220 above device stratum 515. Disposed above interconnects 520, as viewed, is carrier substrate 540 that is similar to carrier substrate 180 described above with reference to FIGS. 5A-17. Connected to devices of die 510 through second side 5100B of the die, in this embodiment, are interconnects 530 that may be, for example, power interconnects (VDD, VDD-gated and VSS), logic interconnects or both. Interconnects 530 on second side or backside 5100B include one or more levels or rows of metallization. With reference to FIGS. 10A-11, interconnect 190A is representative of a first level of interconnects 530 below device stratum 515. FIG. 23 also shows that ones of such level(s) of metallization are connected to contact points (e.g., C4 bumps) 550 that are operable to connect die 510 to package 590. FIG. 23 further shows VDD and VSS connections to die 510 through package substrate 590.

Figure 24:
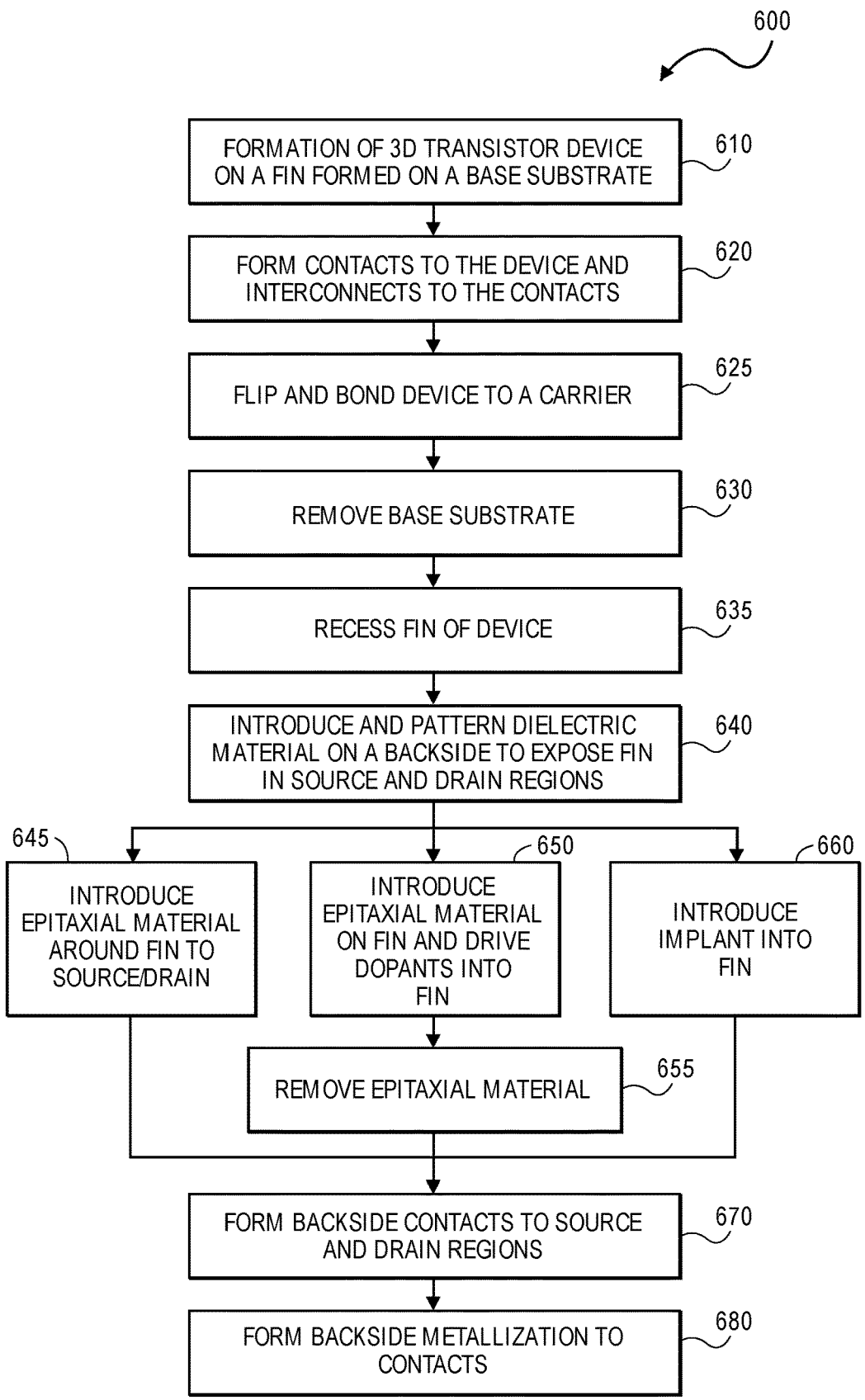
FIG. 24 is a flow chart of a process to form contacts to source and drains of a three dimensional transistor device from a backside and backside metallization.

FIG. 24 is a flow chart of a process to form contacts to source and drains of a three-dimensional transistor device from a backside and backside metallization. Referring to FIG. 24, process 600 begins with the formation of a three-dimensional transistor device on a base substrate, the device including a fin extending from the base substrate and a source and drain formed in or on the fin (block 610). Sacrificial material may optionally be formed on a base of the fin as described above with reference to FIG. 18. From a first side or device side of the structure, contacts are formed to the device and device side metallization is built (block 620). Following building of metallization, the device is flipped and bonded device side down to a carrier (block 625). The base substrate is then removed to expose the fin (block 630) and the fin is optionally recessed (block 635). Dielectric material is then introduced and patterned on a backside of the device with vias or openings around the fin to the source and drain (block 640). If sacrificial material was previously formed on a base of the fin, the sacrificial material is removed. In one embodiment, epitaxial material is then introduced on and around the fin to the source and drain (block 645). In a second embodiment, a doped epitaxial material is introduced on the fin and dopants in the epitaxial material are driven into the fin (block 650). According to this second embodiment, following dopant drive-in, the epitaxial material may optionally be removed (block 655). In a third embodiment, an implant is introduced into the fin in source and drain regions (block 660). Following one of the above embodiments, the backside vias or openings are filled with contact material to make backside contacts to source and drain, respectively (block 670). Backside metallization is then optionally built (block 675).

The above embodiments describe the formation of transistor devices having backside contacts. While three-dimensional transistor devices were presented, such presentation is not meant to be limiting. The implementation of backside transistor contacts and techniques related to their formation apply to other devices, including nanowire devices and planar devices.

Figure 25:
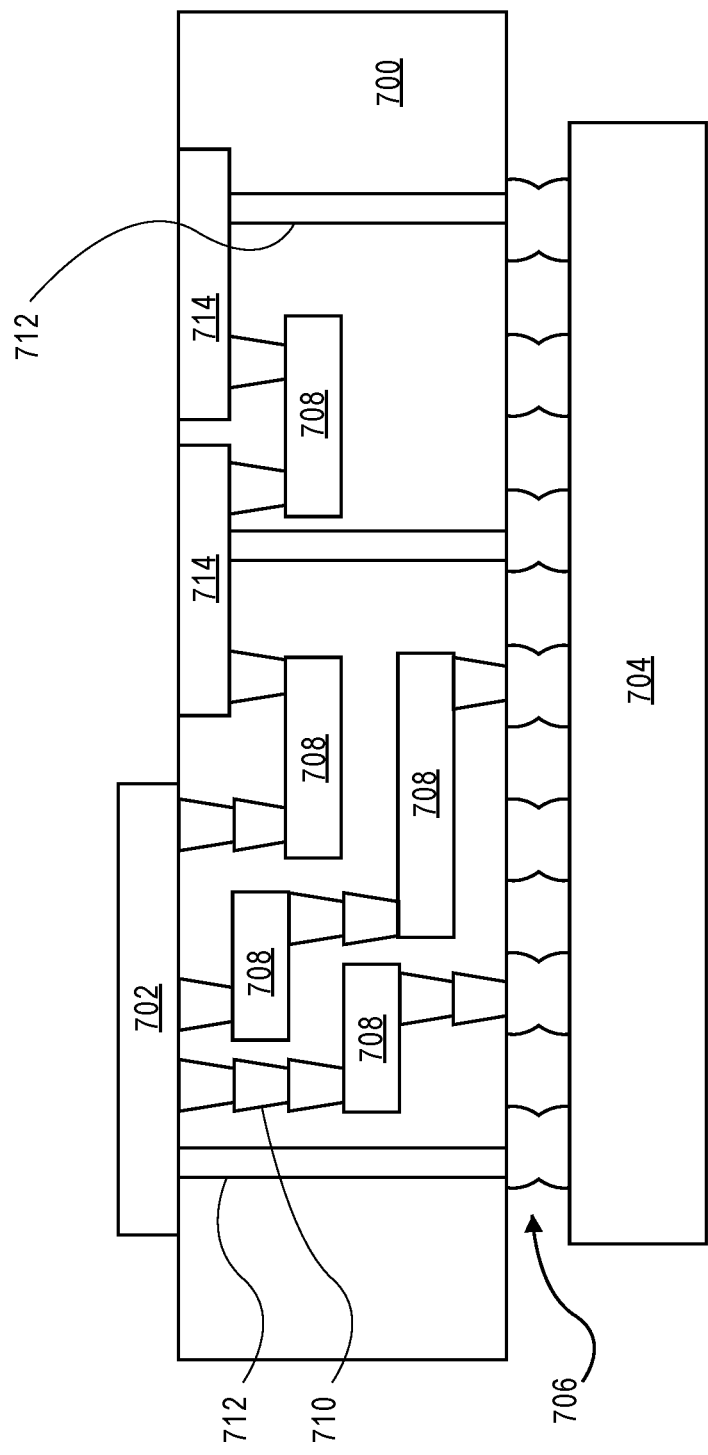
FIG. 25 is an interposer implementing one or more embodiments.

FIG. 25 illustrates interposer 700 that includes one or more embodiments. Interposer 700 is an intervening substrate used to bridge a first substrate 702 to second substrate 704. First substrate 702 may be, for instance, an integrated circuit die. Second substrate 704 may be, for instance, a memory module, a computer motherboard, or another integrated circuit die. Generally, the purpose of interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of interposer 700. In other embodiments, the first and second substrates 702/704 are attached to the same side of interposer 700. In further embodiments, three or more substrates are interconnected by way of interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials.

The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 700.

In accordance with embodiments, apparatuses or processes disclosed herein may be used in the fabrication of interposer 700.

Figure 26:
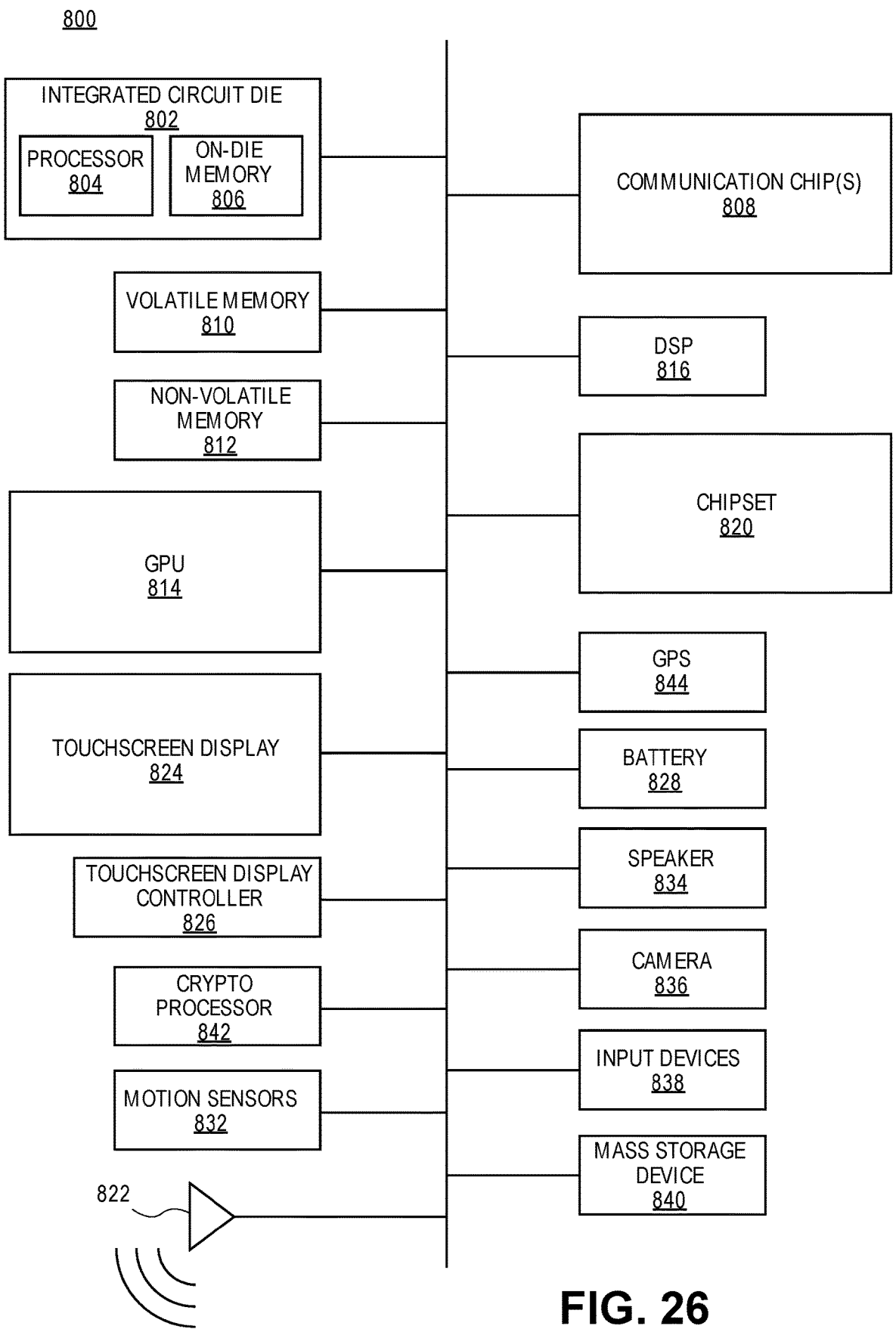
FIG. 26 illustrates an embodiment of a computing device.

FIG. 26 illustrates a computing device 800 in accordance with one embodiment. The computing device 800 may include a number of components. In one embodiment, these components are attached to one or more motherboards. In an alternate embodiment, these components are fabricated onto a single system-on-a-chip (SoC) die rather than a motherboard. The components in the computing device 800 include, but are not limited to, an integrated circuit die 802 and at least one communication chip 808. In some implementations the communication chip 808 is fabricated as part of the integrated circuit die 802. The integrated circuit die 802 may include a CPU 804 as well as on-die memory 806, often used as cache memory, that can be provided by technologies such as embedded DRAM (eDRAM) or spin-transfer torque memory (STTM or STTM-RAM).

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (a specialized processor that executes cryptographic algorithms within hardware), a chipset 820, an antenna 822, a display or a touchscreen display 824, a touchscreen controller 826, a battery 828 or other power source, a power amplifier (not shown), a global positioning system (GPS) device 844, a compass 830, a motion coprocessor or sensors 832 (that may include an accelerometer, a gyroscope, and a compass), a speaker 834, a camera 836, user input devices 838 (such as a keyboard, mouse, stylus, and touchpad), and a mass storage device 840 (such as hard disk drive, compact disk (CD), digital versatile disk (DVD), and so forth).

The communications chip 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 808. For instance, a first communication chip 808 may be dedicated to shorter range wireless communications such as Wi-Fi and Bluetooth and a second communication chip 808 may be dedicated to longer range wireless communications such as GPS, EDGE, GPRS, CDMA, WiMAX, LTE, Ev-DO, and others.

The processor 804 of the computing device 800 includes one or more devices, such as transistors or metal interconnects, that are formed in accordance with embodiments including backside contacts to device and optional backside metallization. The term "processor" may refer to any device or portion of a device that processes electronic data from registers and/or memory to transform that electronic data into other electronic data that may be stored in registers and/or memory.

The communication chip 808 may also include one or more devices, such as transistors or metal interconnects, that are formed in accordance with embodiments including backside contacts to device and optional backside metallization.

In further embodiments, another component housed within the computing device 800 may contain one or more devices, such as transistors or metal interconnects, that are formed in accordance with implementations including backside contacts to device and optional backside metallization.

In various embodiments, the computing device 800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

EXAMPLES

Example 1 is an apparatus including a circuit structure including a device stratum including a plurality of devices including a first side and an opposite second side; and a metal interconnect coupled to at least one of the plurality of devices from the second side of the device stratum.

In Example 2, the metal interconnect of the apparatus of Example 1 is a first metal interconnect, the apparatus further including a second metal interconnect coupled to the device from the first side of the device stratum.

In Example 3, the at least one of the plurality of devices of the apparatus of any of Example 1 or 2 includes a transistor device and the metal interconnect is coupled to a source or a drain of the transistor device.

In Example 4, the metal interconnect of the apparatus of Example 3 is a first metal interconnect, the apparatus further including a second metal interconnect coupled to the other of the source or the drain of the transistor device from the second side of the device stratum.

In Example 5, the metal interconnect of the apparatus of Example 3 is a first metal interconnect, the apparatus further including a second metal interconnect coupled to a gate of the transistor device from the first side of the device stratum.

In Example 6, the one of the source and the drain at a point of coupling to the metal interconnect of the apparatus of Example 3 includes one of a material epitaxially grown on the one of the source and the drain and a material of the one of the source and the drain modified by one of an implanting of a material and a doping with a material.

Example 7 is a method including forming a transistor device including a channel between a source region and a drain region and a gate electrode on the channel defining a first side of the device; and forming an interconnect to one of the source region and the drain region from a second side of the device.

In Example 8, prior to forming the interconnect to the one of the source region and the drain region, the method of Example 7 includes exposing the one of the source region and the drain region from the second side and one of forming a material on the exposed one of the source region and the drain region and modifying a portion of the one of the source region and the drain region.

In Example 9, the method of Example 8 includes forming a material on the exposed one of the source region and the drain region and such forming includes epitaxially growing the material.

In Example 10, the method of Example 8 includes modifying a portion of the one of the source region and the drain region and modifying includes one of doping and implanting a material into the source region and the drain region.

In Example 11, forming the transistor device of the method of any of Examples 7-10 includes forming a fin on a substrate and the source region and the drain region in the fin separated by the channel region and the gate electrode on the channel region of the fin.

In Example 12, prior to forming the interconnect, the method of Example 11 includes exposing an area of the fin from the second side in the one of the source region and the drain region; and introducing a material on the exposed fin area or into the fin in the exposed fin area.

In Example 13, introducing a material on the exposed fin area of the method of Example 12 includes epitaxial growing the material on the fin.

In Example 14, introducing a material into the fin in the exposed fin area of the method of Example 12 includes doping the fin.

In Example 15, the transistor device of the method of any of Examples 12-14 is formed on a substrate and exposing an area of the fin from the second side includes bonding the substrate to a carrier with the transistor device facing the carrier; and removing the substrate.

In Example 16, prior to bonding the substrate to the carrier, the method of any of Examples 12-15 includes forming a spacer material on opposing sidewalls of the one of the source region and the drain region and exposing an area around the fin includes removing the spacer material.

Example 17 is a method including forming a non-planar transistor device including a fin on a substrate and a source region and a drain region in the fin separated by a channel region and a gate electrode on the channel region of the fin defining a first side of the device; bonding the substrate to a carrier with the transistor device facing the carrier; removing the substrate to expose a second side of the device opposite the first side; exposing an area around the fin from the second side of the device in one of the source region and the drain region; and forming an interconnect to one of the source region and the drain region from the second side of the device.

In Example 18, prior to forming the interconnect, the method of Example 17 includes one of forming a material on the exposed area of the source region and the drain region and modifying a portion of the one of the source region and the drain region in the exposed area.

In Example 19, the method of Example 18 includes forming a material on the exposed area of the source region and the drain region and such forming includes epitaxially growing the material.

In Example 20, the method of Example 18 includes modifying a portion of the one of the source region and the drain region and modifying includes one of doping and implanting a material into the source region and the drain region.

In Example 21, the method of Example 18 includes forming a material on the exposed one of the source region and the drain region and such forming includes depositing the material and treating the transistor device to drive in dopants from the material into the one of the source region and the drain region.

In Example 22, prior to bonding the substrate to the carrier, the method of any of Examples 18-21 includes forming a spacer material on opposing sidewalls of the one of the source region and the drain region and exposing an area around the fin includes removing the spacer material.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
    forming a transistor device comprising a channel between a source region and a drain region and a gate electrode on the channel defining a first side of the device, wherein forming the transistor device comprises forming a fin, and wherein the gate electrode is formed over a top and along sidewalls of the fin; and
    forming an interconnect to one of the source region and the drain region from a second side of the device, the second side of the device opposite the top of the fin.

2. The method of claim 1, wherein prior to forming the interconnect to the one of the source region and the drain region, the method comprises exposing the one of the source region and the drain region from the second side and one of forming a material on the exposed one of the source region and the drain region or modifying a portion of the one of the source region and the drain region.

3. The method of claim 2, wherein the method comprises forming a material on the exposed one of the source region and the drain region and such forming comprises epitaxially growing the material.

4. The method of claim 2, wherein the method comprises modifying a portion of the one of the source region and the drain region and modifying comprises one of doping or implanting a material into the source region and the drain region.

5. The method of claim 1, wherein prior to forming the interconnect, the method comprises:
exposing an area of the fin from the second side in the one of the source region and the drain region; and
introducing a material on the exposed fin area or into the fin in the exposed fin area.

6. The method of claim 5, wherein introducing a material on the exposed fin area comprises epitaxial growing the material on the fin.

7. The method of claim 5, wherein introducing a material into the fin in the exposed fin area comprises doping the fin.

8. The method of claim 5, wherein the transistor device is formed on a substrate and exposing an area of the fin from the second side comprises:
bonding the substrate to a carrier with the transistor device facing the carrier; and
removing the substrate.

9. The method of claim 8, wherein prior to bonding the substrate to the carrier, the method comprises forming a spacer material on opposing sidewalls of the one of the source region and the drain region and exposing an area around the fin comprises removing the spacer material.

10. A method comprising:
forming a non-planar transistor device comprising a fin on a substrate and a source region and a drain region in the fin separated by a channel region and a gate electrode on the channel region of the fin defining a first side of the device;
bonding the substrate to a carrier with the transistor device facing the carrier;
removing the substrate to expose a second side of the device opposite the first side;
exposing an area around the fin from the second side of the device in one of the source region and the drain region; and
forming an interconnect to one of the source region and the drain region from the second side of the device.

11. The method of claim 10, wherein prior to forming the interconnect, the method comprises one of forming a material on the exposed area of the source region and the drain region and modifying a portion of the one of the source region and the drain region in the exposed area.

12. The method of claim 11, wherein the method comprises forming a material on the exposed area of the source region and the drain region and such forming comprises epitaxially growing the material.

13. The method of claim 11, wherein the method comprises modifying a portion of the one of the source region and the drain region and modifying comprises one of doping and implanting a material into the source region and the drain region.

14. The method of claim 11, wherein the method comprises forming a material on the exposed one of the source region and the drain region and such forming comprises depositing the material and treating the transistor device to drive in dopants from the material into the one of the source region and the drain region.

15. The method of claim 11, wherein prior to bonding the substrate to the carrier, the method comprises forming a spacer material on opposing sidewalls of the one of the source region and the drain region and exposing an area around the fin comprises removing the spacer material.

16. A method comprising:
forming a circuit structure comprising a device stratum comprising a plurality of devices, the device stratum comprising a first side and an opposite second side, wherein at least one of the plurality of devices comprises a transistor device, the transistor device having a gate, a source region, a drain region, and a channel region between the source region and the drain region, and wherein the source region and the drain region are both in the first side of the device stratum;
forming a first metal interconnect coupled to one of the source region or the drain region of the transistor device by a first contact from the second side of the device stratum; and
forming a second metal interconnect coupled to the one of the source region or the drain region of the transistor device by a second contact from the first side of the device stratum, wherein the second contact vertically overlaps the first contact.

17. The method of claim 16, further comprising:
forming a third metal interconnect coupled to the other of the source or the drain of the transistor device from the second side of the device stratum.

18. The method of claim 16, further comprising
forming a third metal interconnect coupled to the gate of the transistor device from the first side of the device stratum.

19. The method of claim 16, wherein the one of the source and the drain at a point of coupling to the metal interconnect comprises one of a material epitaxially grown on the one of the source and the drain and a material of the one of the source and the drain modified by one of an implanting of a material and a doping with a material.

20. A method of fabricating a computing device, the method comprising:
providing a board; and
coupling a component to the board, the component including an integrated circuit structure, comprising:
a circuit structure comprising a device stratum comprising a plurality of devices, the device stratum comprising a first side and an opposite second side, wherein at least one of the plurality of devices comprises a transistor device, the transistor device having a gate, a source region, a drain region, and a channel region between the source region and the drain region, and wherein the source region and the drain region are both in the first side of the device stratum;
a first metal interconnect coupled to one of the source region or the drain region of the transistor device by a first contact from the second side of the device stratum; and
a second metal interconnect coupled to the one of the source region or the drain region of the transistor device by a second contact from the first side of the device stratum, wherein the second contact vertically overlaps the first contact.

21. The method of claim 20, the method further comprising:
coupling a memory to the board.

22. The method of claim 20, wherein the component is selected from the group consisting of a processor, a communications chip, and a digital signal processor.

23. The method of claim 20, wherein the computing device is selected from the group consisting of a mobile phone, a laptop, a desk top computer, a server, and a set-top box.

24. A method comprising:
forming a transistor device comprising a channel between a source region and a drain region and a gate electrode on the channel defining a first side of the device; and forming an interconnect to one of the source region and the drain region from a second side of the device, wherein prior to forming the interconnect to the one of the source region and the drain region, the method comprises exposing the one of the source region and the drain region from the second side and one of epitaxially growing a material on the exposed one of the source region and the drain region or modifying a portion of the one of the source region and the drain region, the modifying comprising one of doping and implanting a material into the source region and the drain region.

\* \* \* \* \*